United States Patent [19]

Tsunoo et al.

[11] 4,116,102

[45] Sep. 26, 1978

[54] INTEGRATED CIRCUIT FOR AN ELECTRONIC MUSICAL INSTRUMENT

[75] Inventors: Masahiko Tsunoo, Suita; Namio Hirose, Hirakata; Takeji Kimura, Hirakata; Michihiro Inoue, Hirakata; Masaharu Sato, Noriguchi, all of Japan

[73] Assignee: Matsushita Electric Industrial Co., Ltd., Osaka, Japan

[21] Appl. No.: 718,320

[22] Filed: Aug. 27, 1976

[30] Foreign Application Priority Data

Sep. 3, 1975 [JP] Japan ............................... 50-107180

[51] Int. Cl.[2] ........................ G10H 1/06; H01L 27/02

[52] U.S. Cl. ...................................... 84/1.22; 84/1.13; 84/1.01; 357/42; 357/43; 357/51

[58] Field of Search ...................... 84/1.01, 1.11, 1.13, 84/1.19, 1.21, 1.22, 1.23; 357/43, 51, 42

[56] References Cited

U.S. PATENT DOCUMENTS

| | | | |
|---|---|---|---|
| 3,489,842 | 1/1970 | Ayres | 84/1.01 |
| 3,534,144 | 10/1970 | Ring | 84/1.01 |
| 3,617,598 | 11/1971 | Woody | 84/1.01 |
| 3,637,915 | 1/1972 | Hirano | 84/1.13 |
| 3,755,609 | 8/1973 | Millet | 84/1.23 |
| 3,835,236 | 9/1974 | Adachi | 84/1.11 |
| 3,861,263 | 1/1975 | Okudaira | 84/1.11 |

*Primary Examiner*—Robert K. Schaefer
*Assistant Examiner*—William L. Feeney
*Attorney, Agent, or Firm*—Wenderoth, Lind & Ponack

[57] ABSTRACT

The present invention is an integrated circuit for an electronic musical instrument comprising: a plurality of frequency divider chains receiving a plurality of input signals for dividing the frequencies of the input signals one after another and corresponding to a plurality of series of adjacent notes which are chromatically arranged in turn in a twelve-tone of a musical scale, respectively; keyer-gates for switching on and off the input signals and output signals of the frequency dividers of the frequency divider chains respectively; and adding means for adding at least two output signals of the keyer-gates which correspond to the adjacent notes chromatically arranged to each other, so as to produce output tone signals therefrom, respectively.

6 Claims, 13 Drawing Figures

TX
+5V VRF
TO FIG.3A
f/2
f/4
f/8
f/16
f/32
f/64
158
157
156
155
154
153
152
151
150
149
148
147
171
170
169
168
167
166
165
164
163
162
161
160
159
2r
r
140
175
LADDER NETWORK
141
142
143
144
145
146

TO FIG.3C

GND VRF VDD
1
KEY GATE
125
115
124
114
123
113
122
112
121
111
120
ADD CIRCUIT
415
405
414
404
413
403
412
402
411
401
OY5
OZ5
FY5
FZ5
OY4
OZ4
FY4
FZ4
OY3
OZ3
FY3
FZ3
OY2
OZ2
FY2
FZ2
OY1
OZ1
FY1
FZ1
OUD-5
OUF-5
OUD-4
OUF-4
OUD-3
OUF-3
OUD-2
OUF-2
OUD-1
OUF-1
TO FIG.3B
FXO
FX1
+5V
-10V
416
417
418
419
420
421
VKX1
VRF
VDD
118
117
116
127
126
128
110
137
130
136
+5V
131
132
133
134
135
SUSTAIN CONTROL DEVICE
K1
K2
K3
K4
K5
K6
SCU
VSC

FIG.5a
FIG.5b
FIG.5c
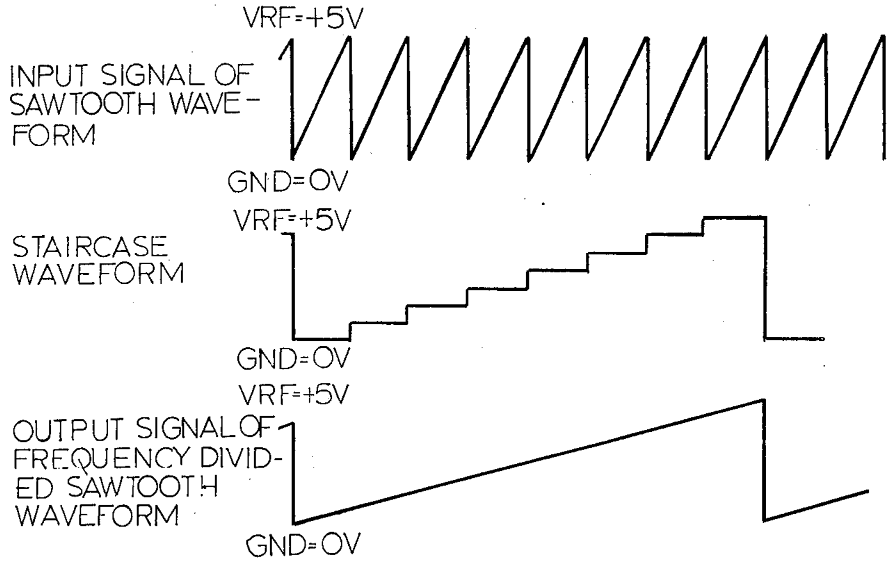
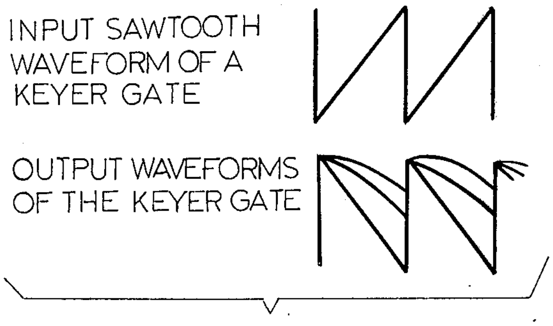
FIG.6
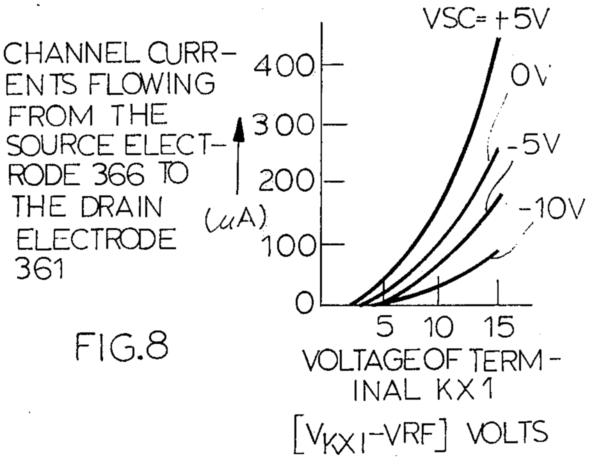
FIG.8
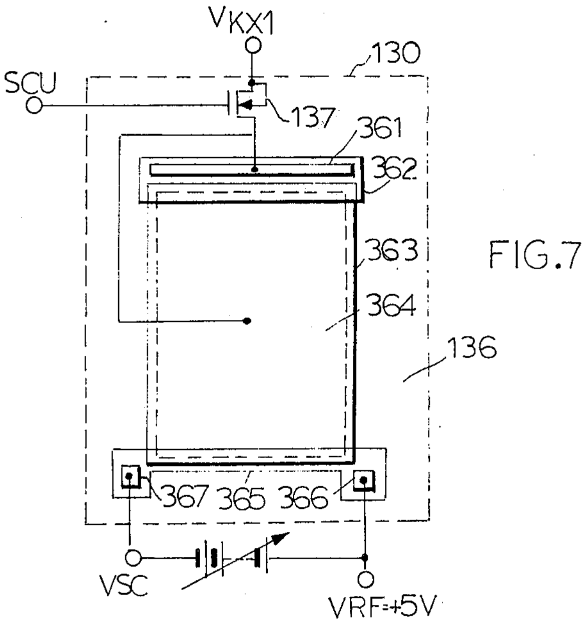
FIG.7

INTEGRATED CIRCUIT FOR AN ELECTRONIC MUSICAL INSTRUMENT

BACKGROUND OF THE INVENTION

This invention relates to an integrated circuit for an electronic musical instrument, which includes on one monolithic semiconductor device, frequency dividers for dividing input signals, keyer-gates for switching on and off tone signals, and adding circuits for adding outputs of the keyer-gates of a plurality of different notes among a twelve-tone of musical scale.

PRIOR ART

There have heretobefore been proposed some types of integrated circuits for electronic musical instruments. For example, the digital organs of Allen Organ Company have utilized digital LSI (large scale integrated circuits) for digitally processing all of the signals in the whole organ system. The LSI organs of Hammond Organ Company have utilized analog LSI for processing signals with frequency dividers and keyer-gates.

In a digital organ, the greater the number of signals or the kind of control signals which are processed (i.e. the larger the system of the digital organ becomes), the larger the benefit of integration becomes. The smaller the system of the digital organ becomes, on the contrary, the smaller the benefit integration becomes. In the LSI organ of Hammond Organ Company, one LSI processes signals of only one series of notes among a 12 tone series because of the limitation of the number of pins of one LSI package, and so many kinds of LSI's are required to satisfy all the necessary product lines. The disadvantage of this prior art LSI technique is that the flexibility in designing many kinds of products is small.

SUMMARY OF THE INVENTION

Therefore, it is an object of this invention to provide an integrated circuit, the use of which makes it possible to design many kinds of electronic musical instruments, and a plurality of which can be used in an electronic musical instrument in accordance with the scale of the system of the electronic musical instrument.

Another object of this invention is to provide an integrated circuit in which a plurality of different series of notes are processed.

A further object of this invention is to provide an integrated circuit by which many more tone signals than those processable by conventional integrated circuits can be processed using a package having a limited number of pins.

These objects are achieved according to this invention by providing an integrated circuit for an electronic musical instrument, which comprises: a plurality of frequency divider chains connected to a plurality of input terminals for dividing frequencies of the input signals one after another and corresponding to a plurality of series of adjacent notes which are chromatically arranged in turn in a twelve-tone of a musical scale, respectively; keyer-gates for switching on and off the input signals and output signals of the frequency dividers of said frequency divider chains respectively; and adding means for adding, at least two output signals of said keyer-gates which correspond to the adjacent notes chromatically arranged to each other, so as to produce output tone signals therefrom, respectively.

An advantage of such an integrated circuit for an electronic musical instrument is that the number of pins or terminals of the integrated circuit can greatly be reduced, because a plurality of adjacent series of notes are integrated on one integrated circuit, and the outputs thereof are added together with the same rank of feet-coupler, so as to produce an added output from one output terminal; and because the frequency divider chains, keyer-gates and adding circuits are integrated on one integrated circuit, and no external means is required for the mutual connections therebetween. It is further advantageous therein that the number of the control terminals for the keyer-gates can be largely reduced because on control terminal can control two or more keyer-gates which handle plural ranks of feet-couplers different from each other. This leads to a still further advantage that a high reliability of the operation of the system can be achieved, because a large number of tone signals are handled in one integrated circuit having relatively small number of the pins or the terminals.

It is advantageous that the integrated circuit of this invention contributes to a high flexibility in designing many kinds of electronic musical instruments, because a substantial part of the electronic circuit in an electronic musical instrument can be constructed by using only one kind of integrated circuit and adjusting the number of the integrated ciructs of this one kind in accordance with the required number of ranks of feet-couplers and the required number of keyboards. Thus, the whole electronic circuit can be constructed by using only one or a few kinds of integrated circuits. Therefore, the electronic musical instruments and the integrated circuits can be easily made in mass production, and the cost of the integrated circuits and the cost for developing many kinds of electronic musical instruments can largely be reduced.

It is still further advantageous that the integrated circuit of this invention can be formed on a monolithic semiconductor wafer by utilizing the manufacturing processes of to form a complementary MOS, a P-MOS, a silicon gate, a bipolar transistor, a diffused semiconductor resistor and a poly-silicon resistor. And it is still further advantageous therein that a sawtooth waveform, a staircase waveform or a rectangular waveform can easily be used as the waveform of the tone signals by slightly modifying the electronic circuit arrangement.

BRIEF DESCRIPTION OF THE DRAWINGS

Other objects, features and advantages of this invention will be made clear from the following detailed description of embodiments thereof considered together with the accompanying drawings, wherein:

FIG. 2 (*b*) is a representative voltage waveform generated by the keying and time constant circuit of FIG. 2 (a);

FIG. 5 and FIG. 6 are diagrams of voltage waveforms appearing at various points of the integrated circuit of FIG. 3;

FIG. 7 is a diagram showing the structure of a sustain control device applicable to the integrated circuits of FIGS. 1 and 3;

FIG. 8 is a diagram showing representative control characteristics of the sustain device of FIG. 7;

DETAILED DESCRIPTION OF THE PREFERED EMBODIMENT

Figure 1A:
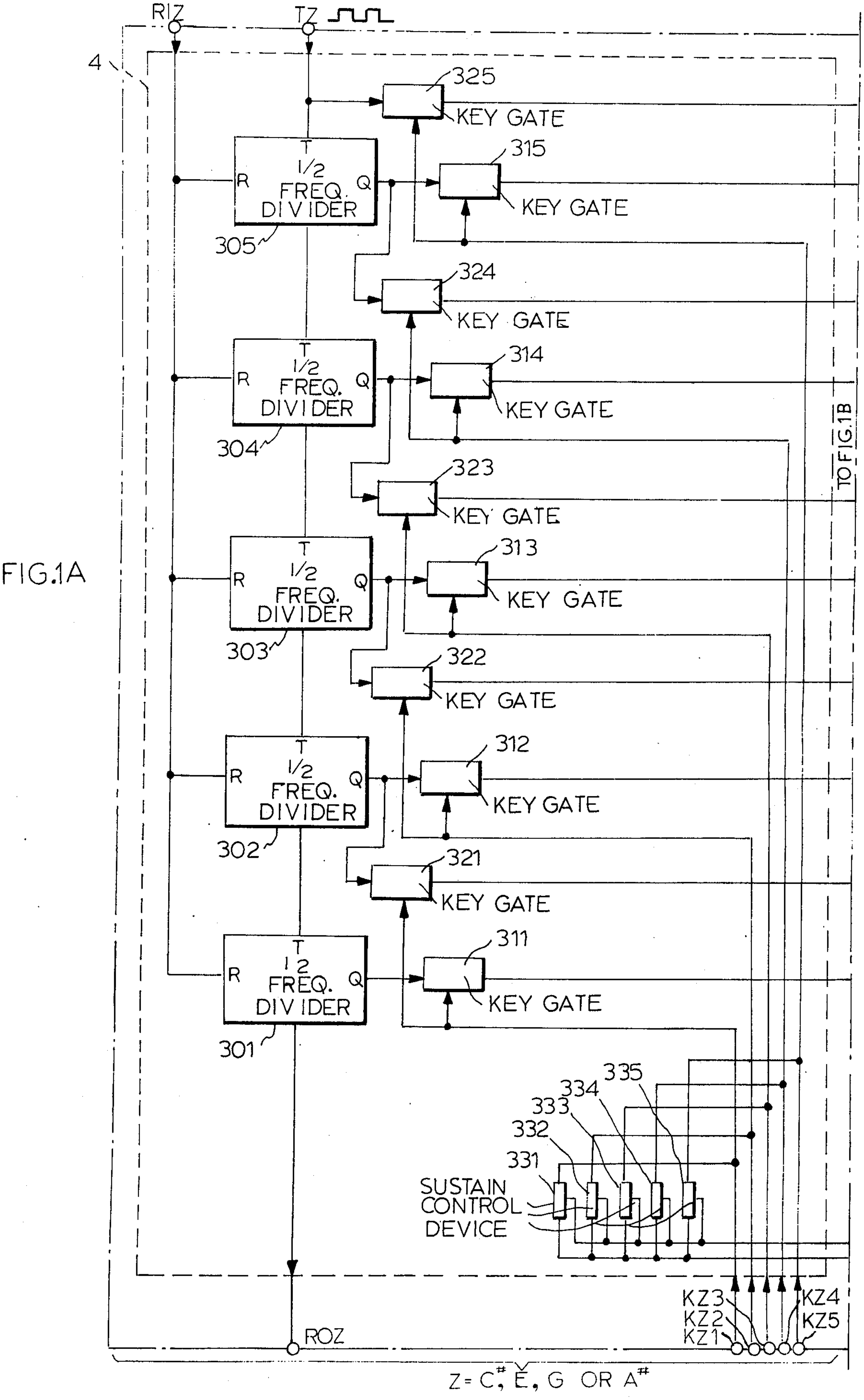
FIG. 1 is a schematic block diagram of a fundamental embodiment of an integrated circuit of this invention for an electronic musical instrument.
Figure 1B:
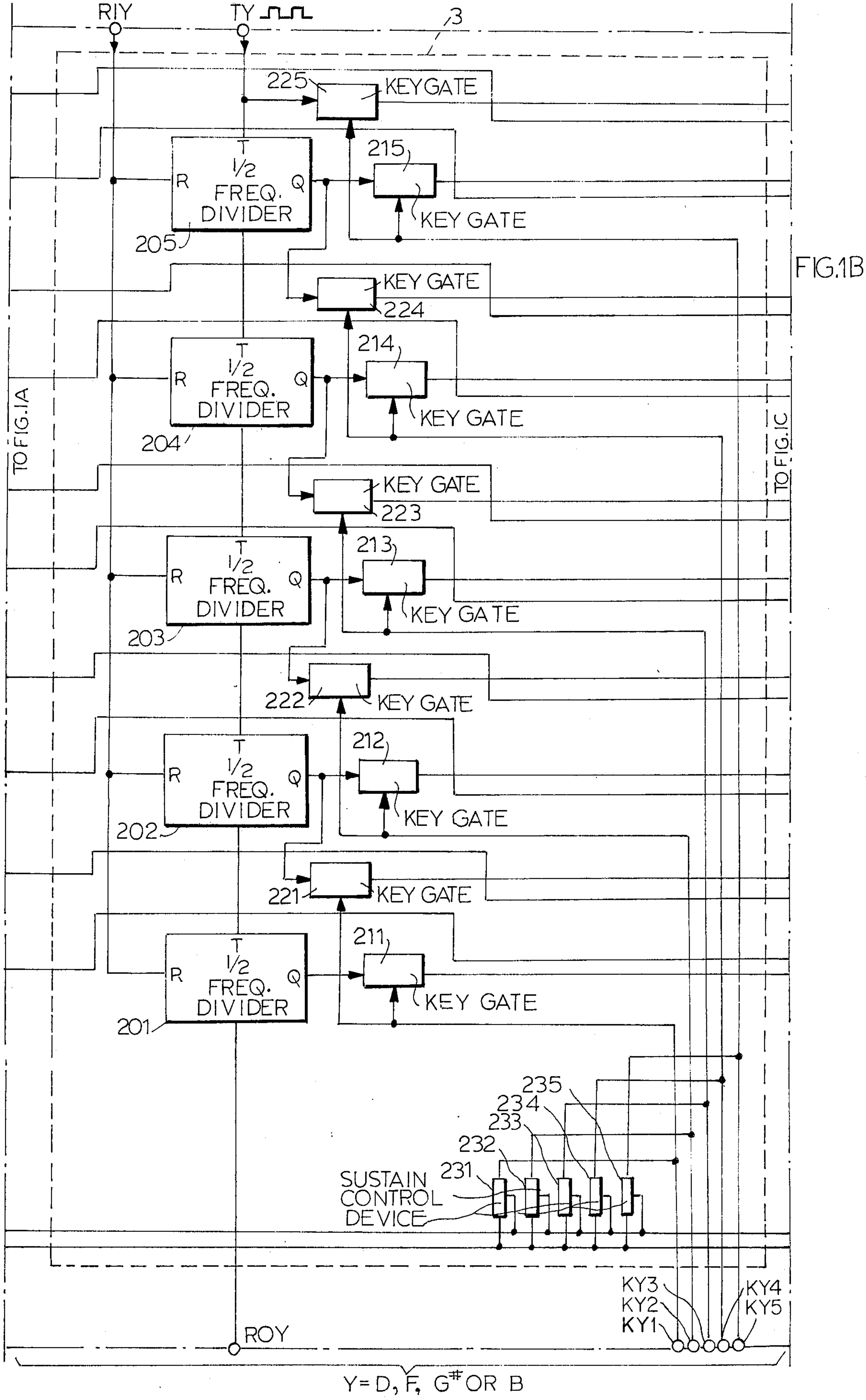
Figure 1C:
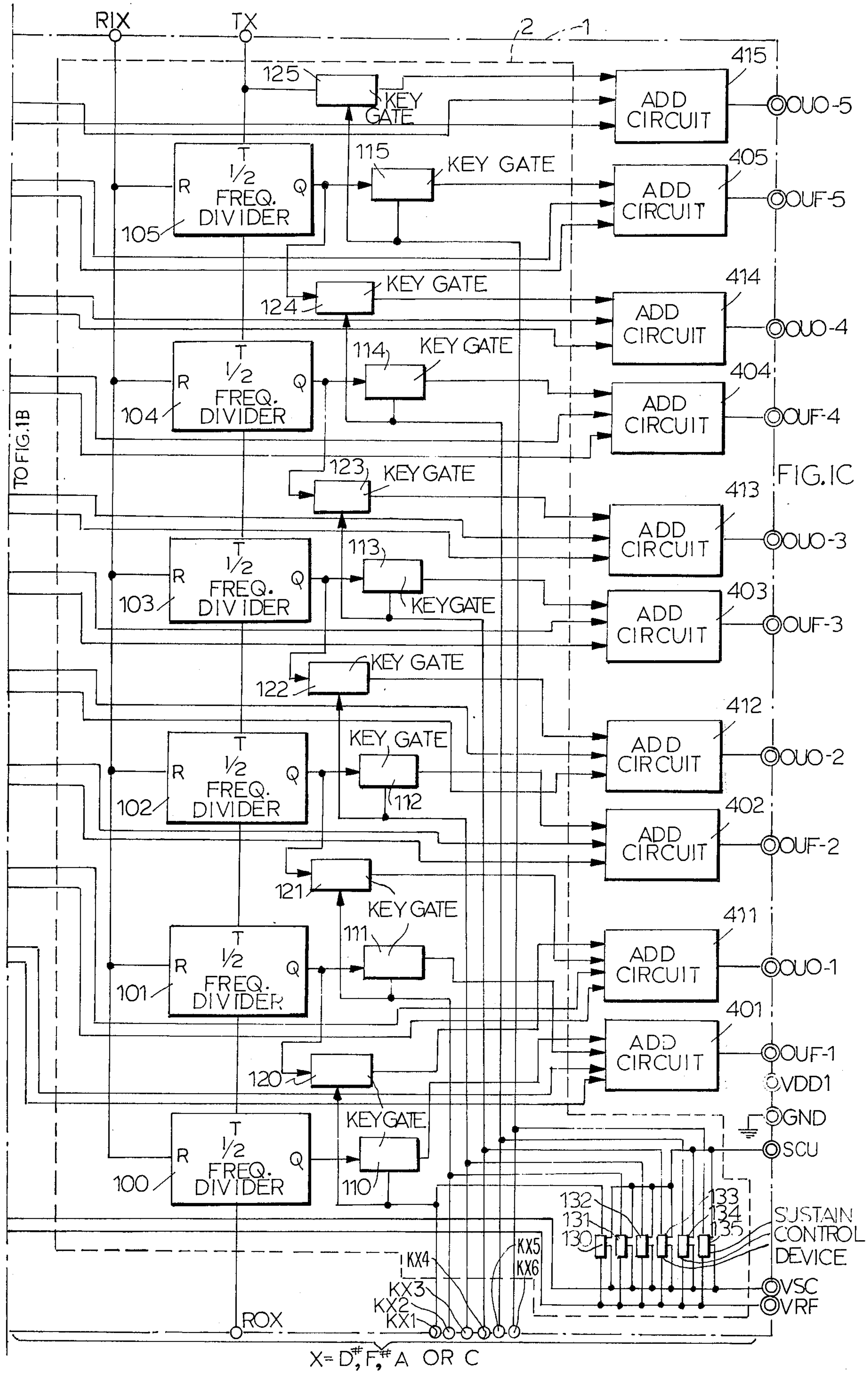

Referring to FIG. 1, an integrated circuit 1 processes tone signals of three series of adjacent notes, e.g. series of notes x, series of notes y and series of notes z, which are chromatically arranged in turn in a twelve-tone of a musical scale. For example, the x series corresponds to D#, F#, A or C series of notes; the y series corresponds to D, F, G# or B series of notes; and the Z series corresponds to C#, E, G or A# series of notes.

The input signal of the x series is applied, through a terminal TX, to a frequency divider chain which comprises frequency dividers 105, 104, 103, 102, 101 and 100. The input signal of the y series is applied, through a terminal TY, to another frequency divider chain which comprises frequency dividers 205, 204, 203, 202 and 201. The input signal of the z series is applied, through a terminal TZ, to a further frequency divider chain which comprises frequency dividers 305, 304, 303, 302 and 301.

In these three frequency divider chains, each frequency divider successively divides the frequency of the input signal or the output signal of the preceding frequency divider by, for example, a factor of two. The outputs of the last stages of the frequency dividers 100, 201 and 301 of the frequency divider chains can also be synchronizing signals and can be applied, through synchronizing output terminals ROX, ROY and ROZ, to the reset input terminals RIX, RIY and RIZ of other integrated circuits having the same structure as that of FIG. 1 and processing the same three series of notes, so as to synchronize the frequency divider chains of the same series of notes with each other, respectively.

The synchronizing signal of the x series of notes from another integrated circuit is applied, through the reset input terminal RIX, to the reset terminals R of the frequency dividers 105, 104, 103, 102, 101 and 100 of the integrated circuit 1, so as to reset them synchronously therewith.

The synchronizing signal of the y series of notes from another integrated circuit is applied, through the reset input terminal RIY, to the reset terminals R of the frequency dividers 205, 204, 203, 202 and 201 of the integrated circuit 1, so as to reset them synchronously therewith. The synchronizing signal of the z series of Z-notes from another integrated circuit is applied, through the reset input terminal RIZ, to the reset terminals R of the frequency dividers 305, 304, 303, 302 and 301 of the integrated circuit 1, so as to reset them synchronously therewith. In order to synchronize two or more frequency divider chains with each other, the lowest octave or frequency among the output synchronizing signals of these divider chains should be used as a synchronizing signal so as to synchronize all the other frequency divider chains.

In the x series of notes, the input signal to the toggle terminal T of the frequency divider 105 is applied, through a keyer-gate 125, to an adding circuit 415. The output signal Q of the frequency divider 105 is applied, through keyer-gates 115 and 124, to adding circuits 405 and 414, respectively. The output signal Q of the frequency divider 104 is applied, through keyer-gates 114 and 123, to adding circuits 404 and 413, respectively. The output signal Q of the frequency divider 103 is applied, through keyer-gates 113 and 122, to adding circuits 403 and 412, respectively. The output signal Q of the frequency divider 102 is applied, through keyer-gates 112 and 121, to adding circuits 402 and 411, respectively. The output signal Q of the frequency divider 101 is applied, through keyer-gates 111 and 120, to adding circuits 401 and 411, respectively. The output signal Q of the frequency divider 100 is applied, through a keyer-gate 110, to an adding circuit 401.

The keyer-gates 110 and 120 are simultaneously controlled by a control signal applied from a control terminal KX1, so as to be switched on and off and to produce a required output signal envelope therefrom. The keyer-gates 111 and 121 are simultaneously controlled by a control signal applied from a control terminal KX2, so as to be switched on and off and to produce a required output signal envelope therefrom. The keyer-gates 112 and 122 are simultaneously controlled by a control signal applied from a control terminal KX3, so as to be switched on and off and to produce a required output signal envelope therefrom. The keyer-gates 113 and 123 are simultaneously controlled by a control signal applied from a control terminal KX4, so as to be switched on and off and to produce a required output signal envelope therefrom. The keyer-gates 114 and 124 are simultaneously controlled by a control signal applied from a control terminal KX5, so as to be switched on and off and to produce a required output signal envelope therefrom. The keyer-gates 115 and 125 are simultaneously controlled by a control signal applied from a control terminal KX6, so as to be switched on and off and to produce a required output signal envelope therefrom. The control terminals KX1, KX2, KX3, KX4, KX5 and KX6 are coupled, through envelope circuits (one of which will be described with reference to FIGS. 2(*a*) and 2(*b*) later), to keyswitches which are octavely related to each other and are actuated by corresponding keys, so as to be supplied with envelope control signals, respectively.

When the keyer-gates 110, 111, 112, 113, 114 and 115 control six fundamental tone signals octavely separated from each other in the x series of notes, then the keyer-gates 120, 121, 122, 123, 124 and 125 control coupler tone signals which are higher in frequency by one octave than said fundamental tone signals, respectively. Thus, the control signal applied to each of the control terminals KX1 to KX6 simultaneously controls two octavely related tone signals which are in two different feet-coupler ranks from each other.

In the y series of notes, the input signal to the toggle terminal T of the frequency divider 205 is applied, through a keyer-gate 225, to an adding circuit 415. The output signal Q of the frequency divider 205 is applied, through keyer-gates 215 and 224, to adding circuits 405 and 414, respectively. The output signal Q of the frequency divider 204 is applied, through keyer-gates 214 and 223, to adding circuits 404 and 413, respectively. The output signal Q of the frequency divider 203 is applied, through keyer-gates 213 and 222, to adding circuits 403 and 412, respectively. The output signal Q of the frequency divider 202 is applied, through keyer-gates 212 and 221, to adding circuits 402 and 411, respectively. The output signal Q of the frequency divider 201 is applied, through a keyer-gate 211, to an adding circuit 401.

The keyer-gates 211 and 221 are simultaneously controlled by a control signal applied from a control terminal KYI, so as to be switched on and off and to produce a required output signal envelope therefrom. The keyer-gates 212 and 222 are simultaneously controlled by a control signal applied from a control terminal KY2, so as to be switched on and off and to produce a required output signal envelope therefrom. The keyer-gates 213 and 223 are simultaneously controlled by a control signal applied from a control terminal KY3, so as to be switched on and off and to produce a required output signal envelope therefrom. The keyer-gates 214 and 224 are simultaneously controlled by a control signal applied from a control terminal KY4, so as to be switched on and off and to produce a required output signal envelope therefrom. The keyer-gates 215 and 225 are simultaneously controlled by a control signal applied from a control terminal KY5, so as to be switched on and off and to produce a required output signal envelope therefrom. The control terminals KY1, KY2, KY3, KY4 and KY5 are coupled, through envelope circuits (one of which will be described with reference to FIGS. 2(*a*) and 2(*b*) later), to keyswitches which are octavely related to each other and are actuated by corresponding keys, so as to be supplied with envelope control signals, respectively.

When the keyer-gates 211, 212, 213, 214 and 215 control five fundamental tone signals octavely separated from each other in the y series of notes, then the keyer-gates 221, 222, 223, 224 and 225 control coupler tone signals which are higher in frequency by one octave than said fundamental tone signals, respectively. Thus, the control signal applied to each of the control terminals KY1 to KY5 simultaneously controls two octavely related tone signals which are in two different feet-coupler ranks from each other.

In the z series of notes, the input signal to the toggle terminal T of the frequency divider 305 is applied, through a keyer-gate 325, to an adding circuit 415. The output signal Q of the frequency divider 305 is applied, through keyer-gates 315 and 324, to adding circuits 405 and 414, respectively. The output signal Q of the frequency divider 304 is applied, through keyer-gates 314 and 323, to adding circuits 404 and 413, respectively. The output signal Q of the frequency divider 303 is applied, through keyer-gates 313 and 322, to adding circuits 403 and 412, respectively. The output signal Q of the frequency divider 302 is applied, through keyer-gates 312 and 321, to adding circuits 402 and 411, respectively. The output signal Q of the frequency divider 301 is applied, through a keyer-gate 311, to an adding circuit 401.

The keyer-gates 311 and 321 are simultaneously controlled by a control signal applied from a control terminal KZ1, so as to be switched on and off and to produce a required output signal envelope therefrom. The keyer-gates 312 and 322 are simultaneously controlled by a control signal applied from a control terminal KZ2, so as to be switched on and off and to produce a required output signal envelope therefrom. The keyer-gates 313 and 323 are simultaneously controlled by a control signal applied from a control terminal KZ3, so as to be switched on and off and to produce a required output signal envelope therefrom. The keyer-gates 314 and 324 are simultaneously controlled by a control signal applied from a control terminal KZ4, so as to be switched on and off and to produce a required output signal envelope therefrom. The keyer-gates 315 and 325 are simultaneously controlled by a control signal applied from a control terminal KZ5, so as to be switched on and off and to produce a required output signal envelope therefrom. The control terminals KZ1, KZ2, KZ3, KZ4 and KZ5 are coupled, through envelope circuits (one of which will be described with reference to FIGS. 2(*a*) and 2(*b*) later), to keyswitches which are octavely related to each other and are actuated by corresponding keys, so as to be supplied with envelope control signals, respectively. When the keyer-gates 311, 312, 313, 314 and 315 control five fundamental tone signals octavely separated from each other in the z series of notes, then the keyer-gates 321, 322, 323, 324 and 325 control coupler tone signals which are higher in frequency by one octave than said fundamental tone signals, respectively. Thus, the control signal applied to each of the control terminals KZ1 to KZ5 simultaneously controls two octavely related tone signals which are in two different feet-coupler ranks from each other.

The adding circuit 401 adds four output signals of the keyer-gates 110, 111, 211 and 311, so as to produce an output tone signal of having a fundamental feet-coupler rank of the lowest (the first) octave at an output terminal OUF-1. The adding circuit 402 adds three output signals of the keyer-gates 112, 212 and 312, so as to produce an output tone signal having a fundamental feet-coupler rank of the second octave at an output terminal OUF-2. The adding circuit 403 adds three output signals of the keyer-gates 113, 213 and 313, so as to produce an output tone signal having a fundamental feet-coupler rank of the third octave at an output terminal OUF-3. The adding circuit 404 adds three output signals of the keyer-gates 114, 214 and 314, so as to produce an output tone signal having a fundamental feet-coupler rank of the fourth octave at an output terminal OUF-4. The adding circuit 405 adds three output signals of the keyer-gates 115, 215 and 315, so as to produce an output tone signal having a fundamental feet-coupler rank of the top (the fifth) octave at an output terminal OUF-5.

The adding circuit 411 adds four output signals of the keyer-gates 120, 121, 221 and 321, so as to produce an output tone signal having an octave feet-coupler rank of the lowest (the first) octave at an output terminal OUO-1. The adding circuit 412 adds three output signals of the keyer-gates 122, 222 and 322, so as to produce an output tone signal having an octave feet-coupler rank of the second octave at an output terminal OUO-2. The adding circuit 413 adds three output signals of the keyer-gates 123, 223 and 323, so as to produce a output tone signal having an octave feet-coupler rank of the third octave at an output terminal OUO-3. The adding circuit 414 adds three output signals of the keyer-gates 124, 224 and 324, so as to produce an output tone signal having an octave feet-coupler rank of the fourth octave at an output terminal OUO-4. The adding circuit 415 adds three output signals of the keyer-gates 125, 225 and 325, so as to produce an output tone signal having an octave feet-coupler rank of the top (the fifth) octave at an output terminal OUO-5.

Thus, each of the output terminals OUF-2, OUF-3, OUF-4 and OUF-5 produces a waveform of three adjacent tone signals added together which are chromatically arranged and which are in each octave of the fundamental feet-coupler rank. Each of the output terminals OUO-2, OUO-3, OUO-4 and OUO-5 produces a waveform of three adjacent tone signals added together which are chromatically arranged and which are in each octave of the octave feet-coupler rank. The output terminal OUF-1 produces, with respect to the fundamental feet-coupler, a waveform of three adjacent tone signals in the lowest octave and one tone signal added together which is lower by one octave than one of the three tone signals in the lowest octave. The output terminal OUO-1 produces, with respect to the octave feet-coupler, a waveform of three adjacent tone signals in the lowest octave and one tone signal added together which is lower by one octave than one of said three tone signals in the lowest octave.

Sustain control devices 130, 131, 132, 133, 134 and 135 are connected between a reference potential VRF and the control terminals, KX1, KX2, KX3, KX4, KX5 and KX6, respectively. Sustain control devices 231, 232, 233, 234 and 235 are connected between the reference potential VRF and the control terminals KY1, KY2, KY3, KY4 and KY5, respectively. Sustain control devices 331, 332, 333, 334 and 335 are connected between the reference potential VRF and the control terminals KZ1, KZ2, KZ3, KZ4 and KZ5, respectively. These sustain control devices 130 to 135, 231 to 235, and 331 to 335 are controlled all together in their resistances or in currents to flow therethrough by a common sustain control voltage VSC.

Figure 2A:
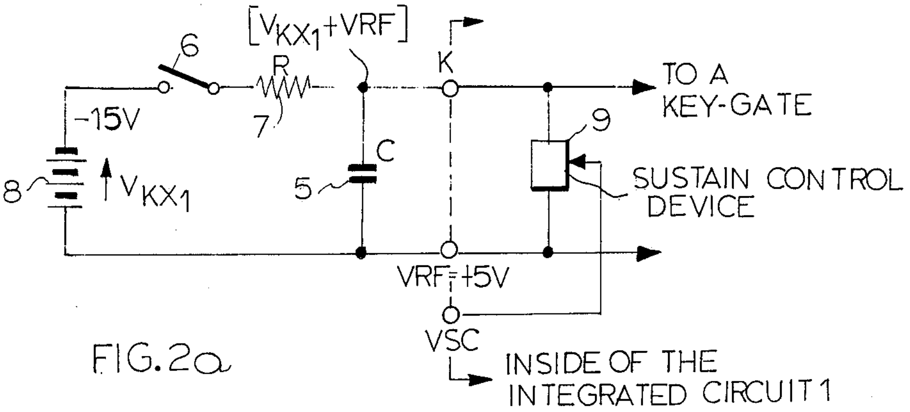
FIG. 2 (*a*) is a diagram illustrating a respresentative keying and time constant circuit which is adaptable to the integrated circuit of this invention.
Figure 2B:
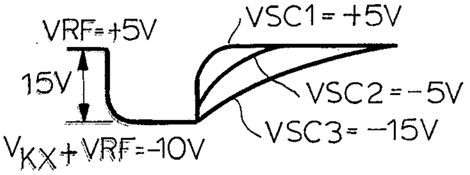

Referring to FIG. 2(*a*), each of the control terminals KX1 (KX1 is representatively shown and can be one of KX1 to KX6, KY1 to KY5, and KZ1 to KZ5) is connected to an envelope generator which comprises a keying and time constant circuit. The envelope generator comprises, for example, a capacitor 5 connected between the control terminal KX1 and the reference potential VRF, a resistor 7 connected between the control terminal K and a movable contact of a keyswitch 6, and a negative voltage source 8 ($V_{KX1}=-15V$) connected between a fixed contact of the keyswitch 6 and the reference potential VRF, the reference potential VRF being, for example, +5 volts. When the keyswitch 6 is closed, the voltage $V_{KZ1}$ of the voltage source 8 charges the capacitor 5, through the resistor 7, from VRF (=+5 volts) to $V_{KX1}$+VRF (=−10 volts), as shown in FIG. 2(b), at a speed depending on the time constant CR of the resistor 7 and capacitor 5. After then, when the keyswitch 6 is opened, the voltage $V_{KX1}$+VRF of the control terminal KX1 is discharged, through the sustain control device 9, from −10 volts to +5 volts (=VRF), at a speed depending on the resistances or conductivities of the sustain control device 9, which are controlled by the sustain control voltages VSC=VSC1, VSC2 and VSC3 applied to the sustain control terminal of the sustain control device 9. The voltage change of the control terminal KX1 controls the switching on and off and the envelope of each of the corresponding keyer-gates 110 to 115, 120 to 125, 211 to 215, 221 to 225, 311 to 315, and 321 to 325, so that each of these keyer-gates is in a normal state without sustain in the case VSC=VSC1(=+5 volts), that each of these keyer-gates is in a relatively short sustain state in the case VSC=VSC2 (=−5 volts), and that each of these keyer-gates is in a long sustain state in the case VSC=VSC 3 (=−15 volts).

The circuit block 2 of FIG. 1 comprises the frequency dividers 100 to 105, the keyer-gates 110 to 115 and 120 to 125 and the sustain control devices 130 to 135, and processes the tone signals of six octaves each of which has two feet-coupler ranks, e.g. 16-feet and 8-feet, in the X series of notes. The circuit block 3 of FIG. 1 comprises the frequency dividers 201 to 205, the keyer-gates 211 to 215 and 221 to 225 and the sustain control devices 231 to 235, and processes the tone signals of five octaves each of which has two feet-coupler ranks, e.g. 16-feet and 8-feet, in the Y series of notes. The circuit block 4 of FIG. 1 comprises the frequency dividers 301 to 305, the keyer-gates 311 to 315 and 321 to 325 and the sustain control devices 331 to 335, and processes the tone signals of six octaves each of which has two feet-coupler ranks, e.g. 16-feet and 8-feet, in the Z series of notes. These circuit blocks 3, 4 and 5 and the adding circuits 401 to 405 and 411 to 415 of FIG. 1 can be integrated in a monolithic semiconductor wafer 1.

Figure 3A:
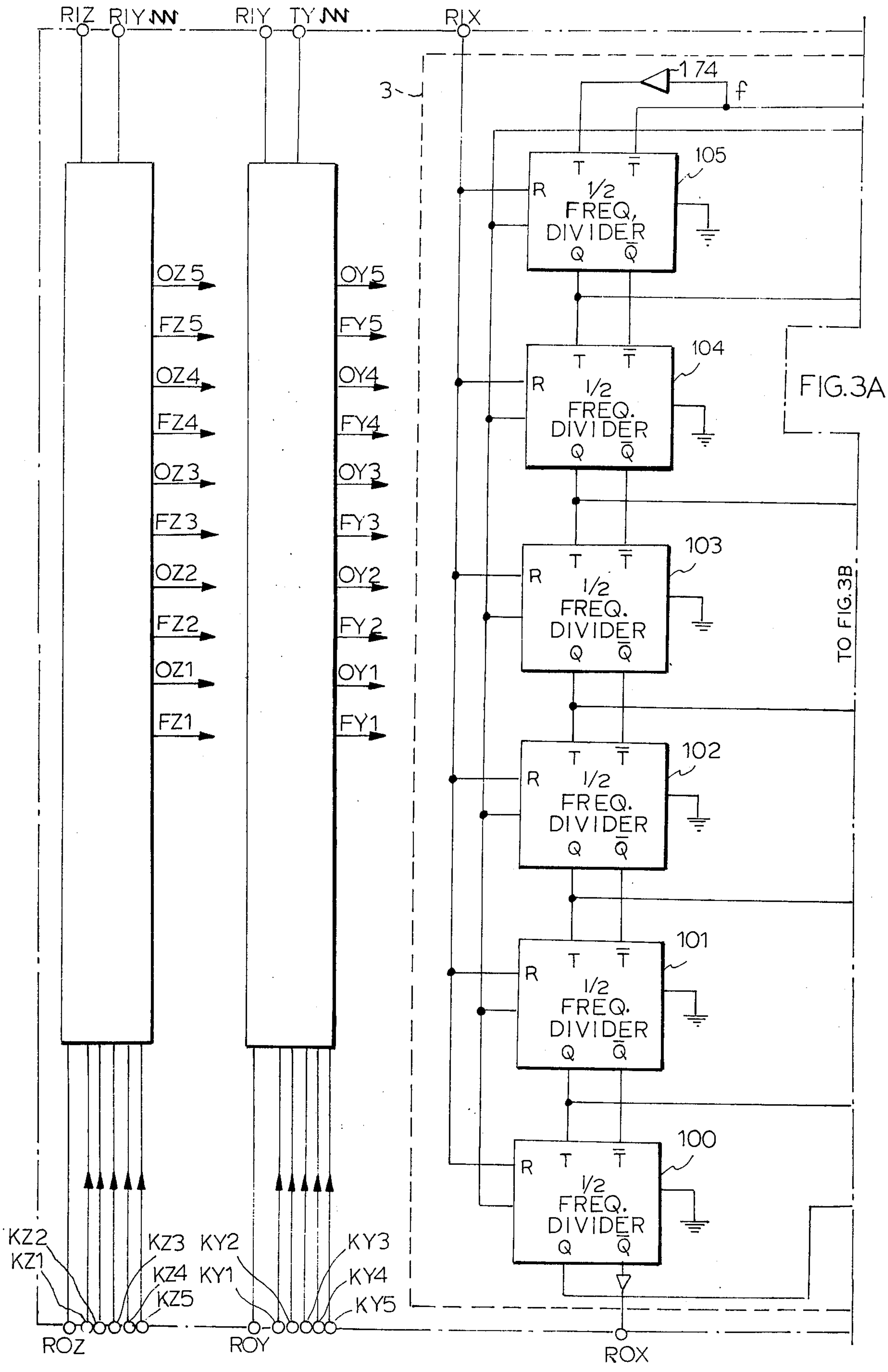
FIG. 3 is a schematic block diagram of another embodiment of an integrated circuit of this invention.
Figure 3B:
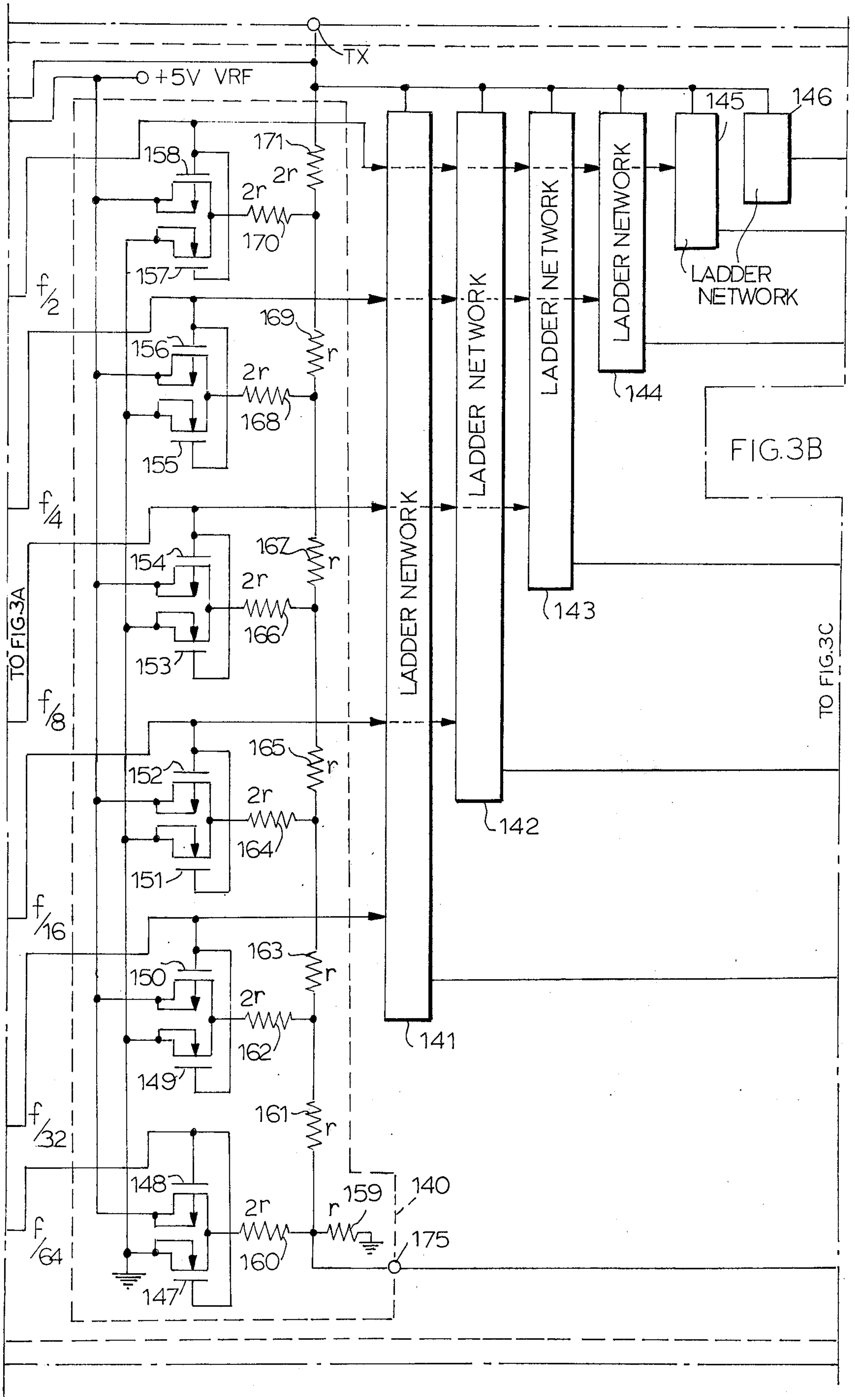
Figure 3C:
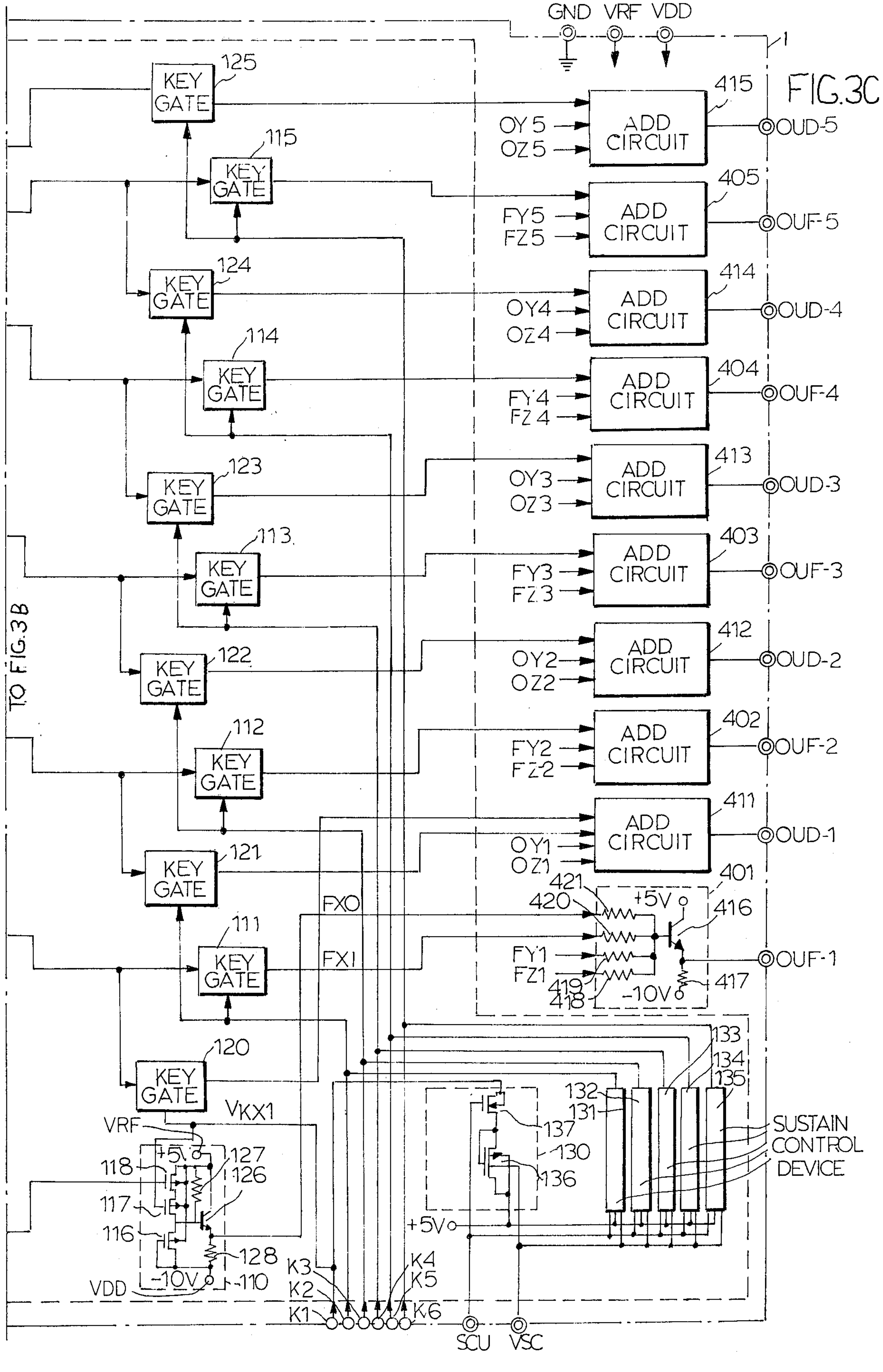

In the embodiment of FIG. 1 a rectangular waveform is utilized for a tone signal. Another embodiment utilizing a sawtooth waveform for a tone signal will hereinafter be described. Referring to FIG. 3, a sawtooth waveform is utilized for a tone signal in an exemplified embodiment. In FIG. 3, the same reference numerals as those used in FIG. 1 are used to designate elements having the same functions or operations as those of the corresponding elements in FIG. 1. Detailed circuits are shown with respect to the circuit block 2 of the X series of notes, in which one circuit is representatively shown among some of same circuits.

Figure 4:
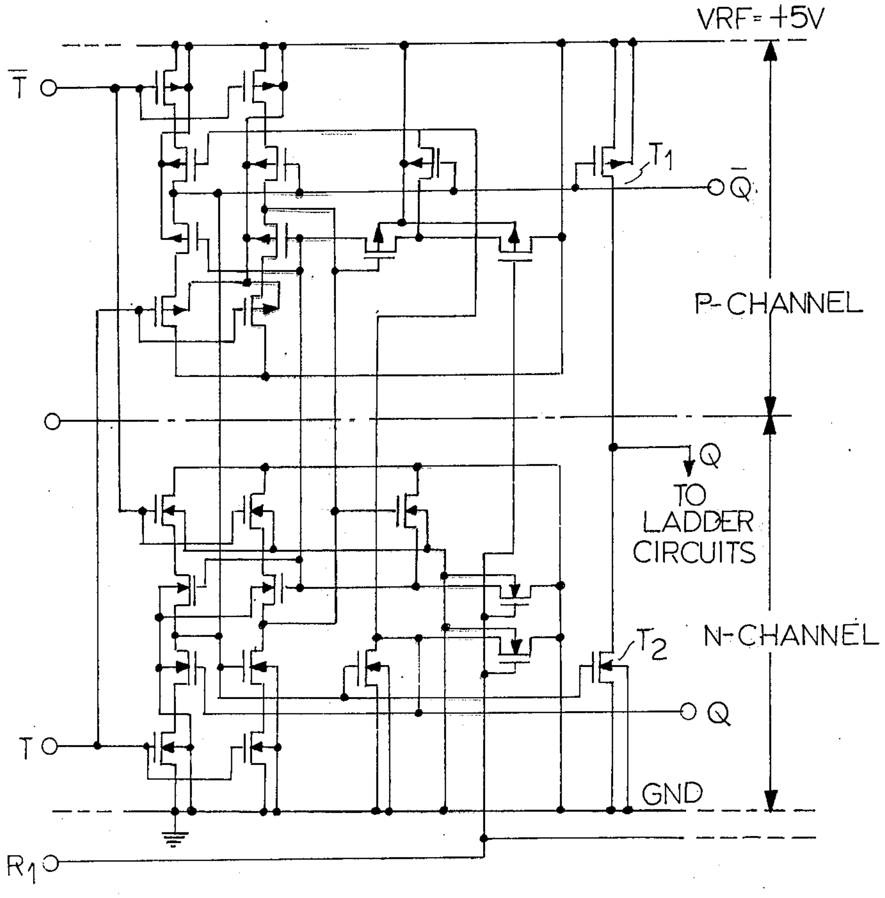
FIG. 4 is a circuit diagram of an embodiment of a frequency divider applicable to the integrated circuits of FIGS. 1 and 3.

The frequency dividers 100 to 105 are composed of complementary MOS static flip-flops each of which has a structure as shown in FIG. 4. The input signal applied to the terminal TX of FIG. 3 is directly fed to a terminal $\bar{T}$, and through an inverter 174 to a terminal T of the flip-flop 105. The output terminals of each of the flip-flops 105 to 101 are successively connected to the terminals T and $\bar{T}$ of the flip-flop of the next stage, respectively. The output terminals Q of these flip-flops are connected, through buffer amplifiers of FIG. 4 comprising P-channel MOSFET $T_1$ and N-channel MOSFET $T_2$, to the next stages of combining circuits, e.g. ladder networks 140, 141, 142, 143, 144, 145 and/or 146 of FIG. 3. The synchronizing signal of the same series of notes from another integrated circuit is applied, through the reset input terminal RIX, to the reset terminals R of FIG. 3 or the reset terminal $R_1$ of FIG. 4. The output terminal $\bar{Q}$ of the flip-flop 100 of the last stage is connected, through a buffer amplifier 173, to the synchronizing output terminal ROX, for deriving the synchronizing signal therefrom. In the integrated circuit 1, therefore, the frequency divider chains of the X, Y and Z series of notes having the reset input terminals RIX, RIY and RIZ and the synchronizing output terminals ROX, ROY and ROZ, respectively.

Each of the combining circuits of the ladder networks 140 to 146 combines the sawtooth input signal from the terminal TX with the outputs from terminals Q of the frequency dividers 100 to 105 so as to produce a sawtooth waveform the frequency of which is divided.

A representative ladder network 140 will be described below as an embodiment of the combining circuit. The ladder network 140 comprises: resistors 171, 169, 167, 165, 163, 161 and 159 connected in series between the terminal TX and ground; pairs of complementary MOSFET's 158 and 157, 156 and 155, 154 and 153, 152 and 151, 150 and 149, and 148 and 147, which are P-channel MOSFET's and N-channel MOSFET's, respectively; and resistors 170, 168, 166, 164, 162 and 160 connected between each junction of said resistors 171, 169, 167, 165, 163, 161 and 159 connected in series and each junction of drains of the each pair of said complementary MOSFET's 158 and 157, 156 and 155, 154 and 153, 152 and 151, 150 and 149, and 148 and 147. The drains of each pair of said complementary MOSFET's are connected to each other. The sources of P-channel MOSFET's 148, 150, 152, 154, 156 and 158 are connected to a voltage source VRF (=+5 volts), and the sources of N-channel MOSFET's 147, 149, 151, 153, 155 and 157 are connected to ground (=0 volt). Each pair of gates of said complementary MOSFET's are connected to each other and connected to the output terminal Q of the frequency divider 100, 101, 102, 103, 104 or 105. The resistance of each of the resistors 160, 162, 164, 166, 168, 170 and 171 is 2r, the resistance of each of the resistors 161, 163, 165, 167 and 169 is *r*, and the resistance of the resistor 159 is *r'* which slightly differs from *r*.

The input signal having a sawtooth waveform applied to the terminal TX is fed directly to the resistor 171 of the ladder network 140, fed directly to the terminal $\bar{T}$ of the top frequency divider 105 of the frequency divider chain, and fed, through the inverter 174, to the terminal T of the top frequency divider 105 of the frequency divider chain. The frequency dividers 105, 104, 103, 102, 101 and 100 of the frequency divider chain divide the frequencies of the input signal having a sawtooth waveform and of the outputs of the preceding frequency dividers by a factor of 2 and generate signals of rectangular waveforms having frequencies equivalent to ½, ¼, ⅛, 1/16, 1/32 and 1/64 of the frequency of the input signal at the output terminals Q, respectively. When the outputs of the terminals Q of the frequency dividers are in "high level" (=+5 V), the N-channel MOSFET's 147, 149, 151, 153, 155 and 157 are switched on, and then the P-channel MOSFET's 148, 150, 152, 154, 156 and 158 are switched off. When these outputs of the terminals Q are in "low level" (=0 volts), the P-channel MOSFET's 148, 150, 152, 154, 156 and 158 are switched on, and then the N-channel MOSFET's 147, 149, 151, 153, 155 and 157 are all switched off. Then the output Q of the frequency dividers 100 to 105 are inverted by the complementary MOSFET's pairs 147 and 148 to 157 and 158 and are fed to the resistors 160, 162 to 170 of 2*r* of the ladder network 140. In such way, the outputs of the frequency dividers 100 to 105 are combined, through the ladder network 140, so as to temporarily generate a staircase waveform, as shown in FIG. 5 (*b*), at the output terminal 175 of the ladder network 140. The staircase waveform of FIG. 5 (*b*) is combined with the sawtooth waveform of FIG. 5 (*a*) which is applied to the input end of the resistor 171, so as to finally produce a frequency divided sawtooth waveform at the output terminal 175, as shown in FIG. 5 (*c*). The detailed descriptions as to the other ladder networks 141, 142, 143, 144, 145 and 146 will be abbreviated here, because the forms and operations of these other ladder networks are the same as those of the ladder network 140, except that there are differences therebetween as to the number of stages of the frequency dividers and the number of resistors, which are used therein.

Any rectangular waveform or any staircase waveform can be applied to the terminal TX as an input signal instead of sawtooth waveform. In such case, a staircase waveform is produced at the output terminal 175 of the ladder network 140 instead of the sawtooth waveform. The staircase waveform is also valuable for a tone signal because its harmonics spectrum is very much similar to that of sawtooth waveform. Any other waveform, of course, can also be used as an input signal to the terminal in special cases.

A representative embodiment of the keyer-gate 110 of FIG. 1 and FIG. 3 will be described below among the keyer-gates 110 to 115 and 120 to 125. The keyer-gate 110 comprises P-channel MOSFET's 116, 117 and 118, and NPN bipolar transistor 126, and resistors 127 and 128 as shown in the enclosure of the dotted line of FIG. 3. The gate and the drain of the MOSFET 116 are commonly connected to a voltage source VDD=−10 volts. The source of the MOSFET 116 is connected to the drain of the MOSFET 117, the source of which is connected to the drain of the MOSFET 118, the source of which is connected, in turn, to the voltage source VFR= +5 volts. The emitter of the NPN transistor 126 is connected, through the resistor 128, to the voltage source VDD (=−10 volts). The collector of the NPN transistor 126 is connected to the voltage source VRF (= −5 volts). The base of the NPN transistor 126 is connected, through the resistor 127, to the voltage source VRF (= +5 volts), and connected directly to the junction of the source of the MOSFET 116 and the drain of the MOSFET 117. Substrates of the MOSFET's 116, 117, and 118 are commonly connected to the voltage source VRF (= +5 volts). In such arrangement, the transistor 126 and the resistors act as a kind of an emitter follower circuit.

The output signal with a sawtooth waveform from the ladder network 140 is applied, through the output terminal 175, to the gate of the MOSFET 118 which is included in the keyer-gate 110. The control signal of the keyer-gate 110 is applied, through the control terminal KX1, to the gate of the MOSFET 117. When a negative going control voltage, as shown in FIG. 2 (*b*), is applied, through the control terminal KX1, to the gate of the MOSFET 117, then the drain of the MOSFET 117 produces a sawtooth waveform having an amplitude change or an envelope corresponding to the change of the amplitude of said negative going control voltage. This sawtooth waveform having an amplitude change is derived, through a buffer amplifier of the emitter follower type composed of the NPN transistor 126, as a keyed output tone signal. This emitter follower eliminates any undesirable nonlinear effects of the keyer-gate 110 resulting from the nonlinearity of the MOSFET. The keyer-gate 110 generally produces a waveform distortion as compared with the input waveform thereto, when the control voltage applied thereto decreases, as shown in FIG. 6 which illustrates the input and the output waveforms of the keyer-gate 110. The waveform distortion is no problem and produces substantially no undesirable effect on the harmonic spectrum or tone quality of the output tone signal. When a rectangular or staircase waveform is applied as an input signal to the terminal IX instead of a sawtooth waveform, the output terminals of the ladder networks 140 to 146 produce the staircase waveforms which are processed by respective keyer-gates in a manner similar to that in the case of the sawtooth input so as to produce the outputs with staircase waveforms. The keyer-gates can also be integrated on the same monolithic semiconductor wafer as that of the frequency divider chains, the ladder networks and the adding circuits.

A representative embodiment of the adding circuit 401 will be described below among the adding circuits 401 to 405 and 411 to 415. The adding circuit 401 comprises an NPN transistor 416, the emitter resistor 417 thereof, and adding resistors 418, 419, 420 and 421. The collector of the transistor 416 is connected to the voltage source VRF(= −5 volts). The emitter of the transistor 416 is connected, through the resistor 417, to the voltage source VDD(= −10 volts). The base of the transistor 416 is connected to the combined end of the adding resistors 418, 419, 420 and 421. The other ends of the adding resistors 421, 420, 419 and 418 are connected, through conductive leads FX0, FX1, FY1 and FZ1 (see FIGS. 1 and 3), to the outputs of the keyer-gates 110, 111, 211 and 311 (see FIGS. 1 and 3). The emitter of the transistor 416 is connected to the output terminal OUF-1 which can produce four output tone signals of the lowest octave in an added form in the case when one or more of four corresponding keyer-gates are keyed on. The bipolar NPN transistor 416 and the resistor 417 act substantially as an emitter follower circuit. In FIG. 3, leads from the circuit blocks 3 and 4 and leads to the adding circuits 401 to 405 and 411 to 415 are connected to each other by conductive leads designated by the same symbols FY1 to FY5, OY1 to OY5, FZ1 to FZ5 and OZ1 to OZ5, respectively.

A representative embodiment of the sustain control device 130 will be described below, in connection with the FIG. 7, among the sustain control devices 130 to 135. The sustain control device 130 comprises a P-channel MOSFET 136 and an N-channel MOSFET 137. The source of the MOSFET 136 is connected to the voltage source VRF (= +5 volts). An electrode 366 provided at the one end of the source region 365 of the MOSFET 136 is also connected to the voltage source VRF(= +5 volts), and another electrode 367 provided at the other end of the source region 365 of the MOSFET 136 is connected to the sustain control voltage source VSC. The gate 363 and the drain 361 of the MOSFET 136 are connected to each other. The drain of the MOSFET 137 is connected to the drain 361 of the MOSFET 136. The source of the MOSFET 137 is connected to the control terminal KX1 and also to the gate of the MOSFET 117. The gate of the MOSFET 137 is connected to a sustain cut terminal SCU. When the sustain cut terminal SCU is supplied with a sufficient negative voltage, e.g. −10 volts, then the MOSFET 137 is cut off so that any voltage of the sustain control voltage source VSC cannot effectively control the sustain control device 130. When the sustain cut terminal SCU is supplied with a sufficient positive voltage, e.g. +5 volts, then the MOSFET 137 is switched on, so that the conductivity of the MOSFET 136 can be controlled by the sustain control voltage VSC.

Referring to FIGS. 7 and 8, the structure and the operation will be described. The drain electrode 361 is provided to cover almost all the drain region 362 of the MOSFET 136. The gate electrode 363 is provided to cover a gate-cut region 364. The source electrode 366 is provided at one end of the source region 365, and a control electrode 367 is provided at the other end of the source region 365. The drain electrode 361 is connected to the gate electrode 363, and connected, through the MOSFET 137, to the control terminal KX1. The source electrode 366 is connected to the voltage source VRF(= +5 volts). The control electrode 367 is connected to the sustain control voltage source VSC. The MOSFET 136 has a structure similar to that of a conventional P-channel MOSFET formed on an N-substrate and has a source region formed by a resistive semiconductor. The electrodes 366 and 367 are provided at the both ends of the source region 365. When a control voltage is applied to one of the ends 367 of the source region 365, a voltage gradient is produced in the source region 365. In FIG. 7, therefore, the potential gradually changes from +5 volts to VSC volts in accordance with the location from the right to the left in the source region 365. Consequently, the current flow from source to drain is not uniform and the current flow at the left side is smaller than at the right side. The more the sustain control voltage is negative, as shown in FIG. 8, the greater the trend of the voltage gradient or the lack of uniformity of current flow becomes. Thus, the total current flow from the source electrode 366 to the drain electrode 361 of the MOSFET 136 is controlled by the sustain control voltage VSC applied to the electrode 367. In the embodiment above, the sustain control device 130 is controlled by a voltage, but such device can be controlled also by other means, e.g. by means of current flow, application of magnetic field, application of light, etc.

In FIGS. 1 and 3, all the terminals, i.e. the terminals TX, TY, TZ, the reset terminals RIX, RIY, RIZ, the synchronizing output terminals ROX, ROY, ROZ, the control terminals KX1 to KX6, KY1 to KY5, KZ1 to KZ5, the output terminals OUF-1 to OUF-5, OUO-1 to OUO-5, the terminals for voltage sources VRF, VDD, GND, the sustain control terminal VSC, and the sustain cut terminal SCU, correspond to respective pins of a package of the integrated circuit.

Figure 9:
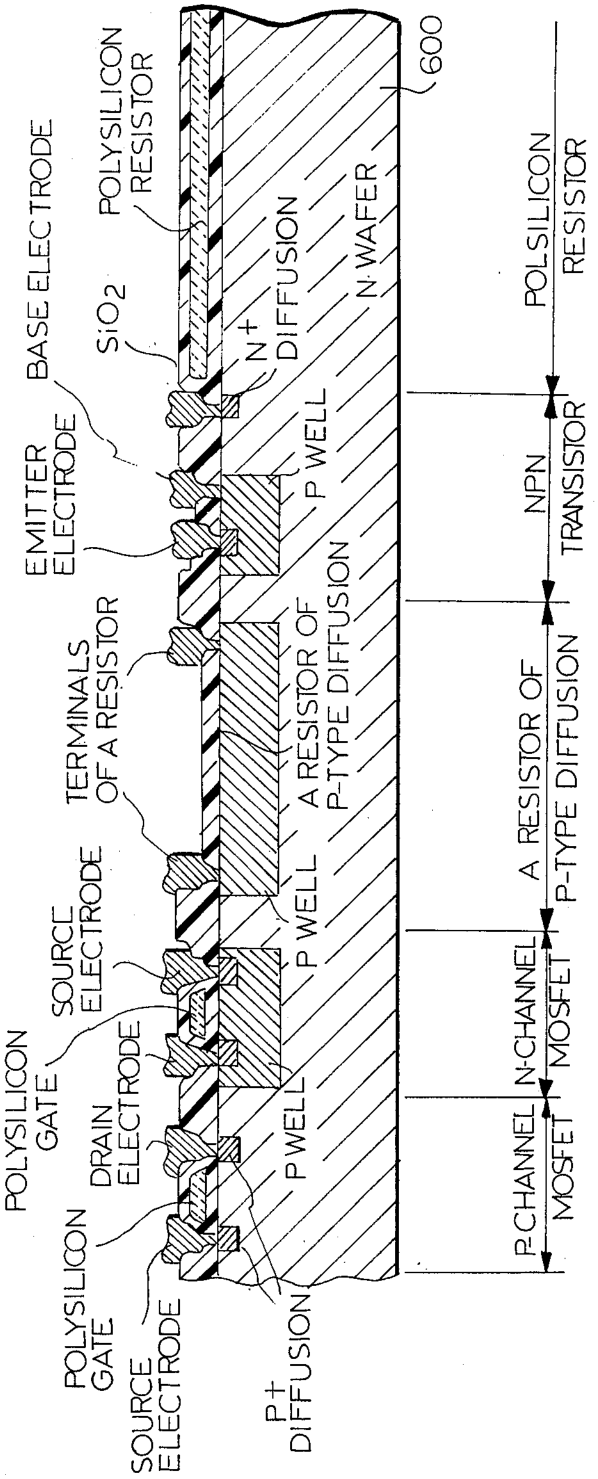
FIG. 9 is a schematic cross-sectional view of an embodiment of an integrated circuit integrated on a monolithic semiconductor wafer and applicable to the integrated circuits of FIGS. 1 and 3.

The integrated circuit 1 shown in FIGS. 1 and 3 can be integrated on a molithic semiconductor wafer 600 as shown in FIG. 9. Referring to FIG. 9 which illustrates a schematic sectional diagram of the integrated circuit 1, devices on an N-wafer are arranged in turn from the left side to the right side in the following order: a P-channel MOSFET, an N-channel MOSFET, a resistor of P-type diffusion, a bipolar NPN transistor, and a resistor of polysilicon type. Although the structures of the integrated circuits of FIGS. 1 and 3 can be integrated on a monolithic semiconductor wafer 600, such structures of this invention can also be formed as a hybrid integrated circuit if desired The integrated circuit 1 described hereinbefore in accordance with this invention can process 32 tone signals in total which comprise five octaves of three series of notes and another octave of one series of notes, for two ranks of feet-coupler. Therefore, four such integrated circuits, for example, are required to form a musical instrument having a keyboard of 61 keys which switch on and off two ranks of feet-coupler, e.g. 16-feet and 8-feet.

TABLES 1 (*a*) and 1 (*b*) show general relations, including the cases of FIGS. 1 and 3, between the number of tone signals N processed in one integrated circuit 1 and the number of integrated circuits P required to generate tone signals for all keys when the integrated circuit has forty connecting pins or terminals per package and utilizes a structure similar to that shown in FIG.

1 or FIG. 3, where $m$ is the number of ranks of feet-coupler per package, $n$ is the number of series of notes per package, and $l$ is the number of octaves per package. Each of TABLES 1 (*a*) and 1 (*b*) shows both the case of one manual keyboard and the case of two manual keyboards, where five connecting pins are used for common terminals such as voltage sources, control signals, etc. in the case of one manual keyboard, and six connecting pins are used for common terminals in the case of two manual keyboards. The embodiments of FIGS. 1 and 3 show the case of one keyboard of 61 Keys in which $l=5$, $m=2$, $n=3$, $N=32$ and $P=4$, and TABLE I (*b*) shows such structures are relatively effective.

Figure 10A:
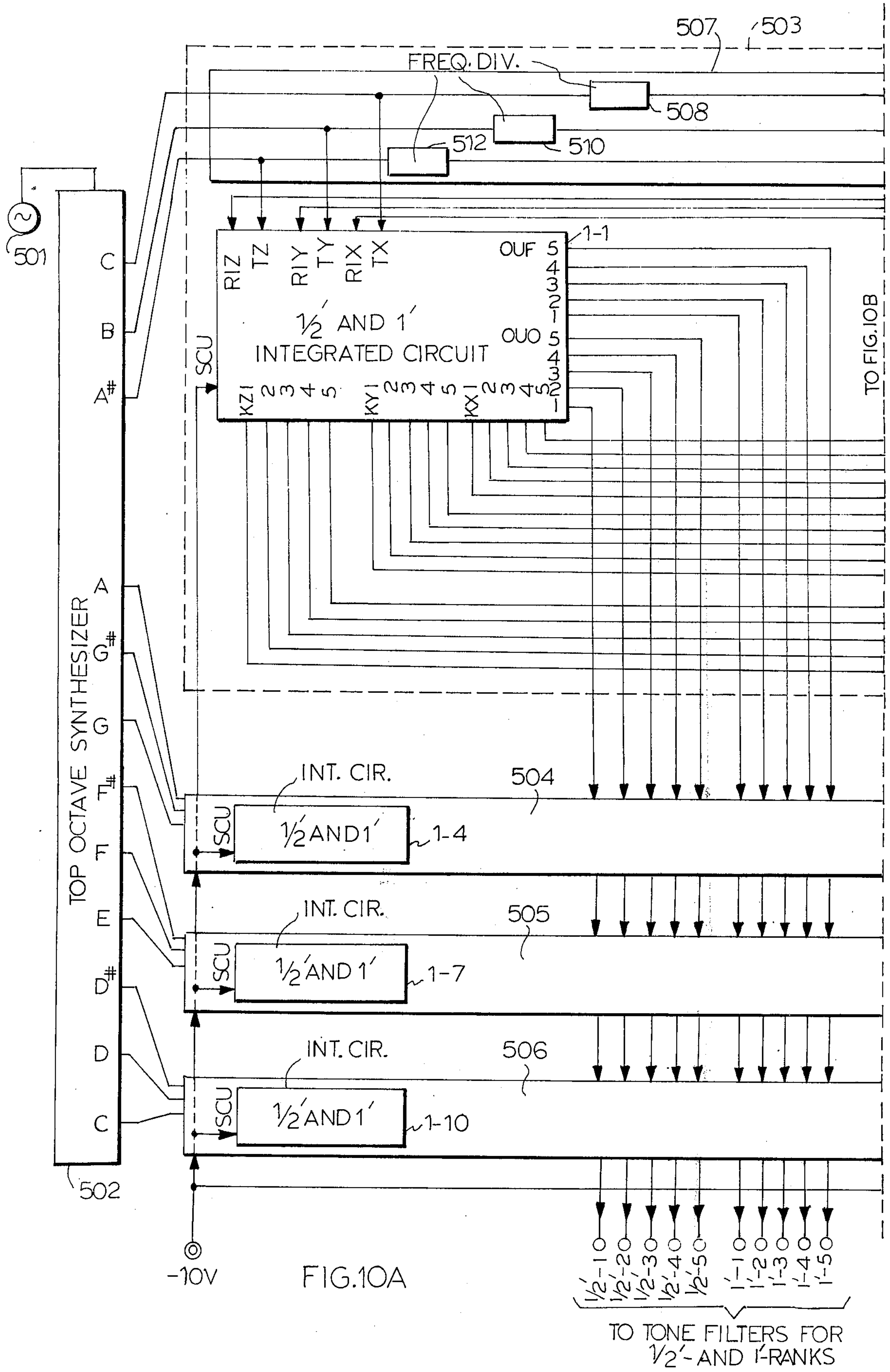
FIG. 10 is a schematic block diagram of the main part of an embodiment of an electronic musical instrument which contains one manual keyboard and which utilizes twelve integrated circuits of this invention.
Figure 10B:
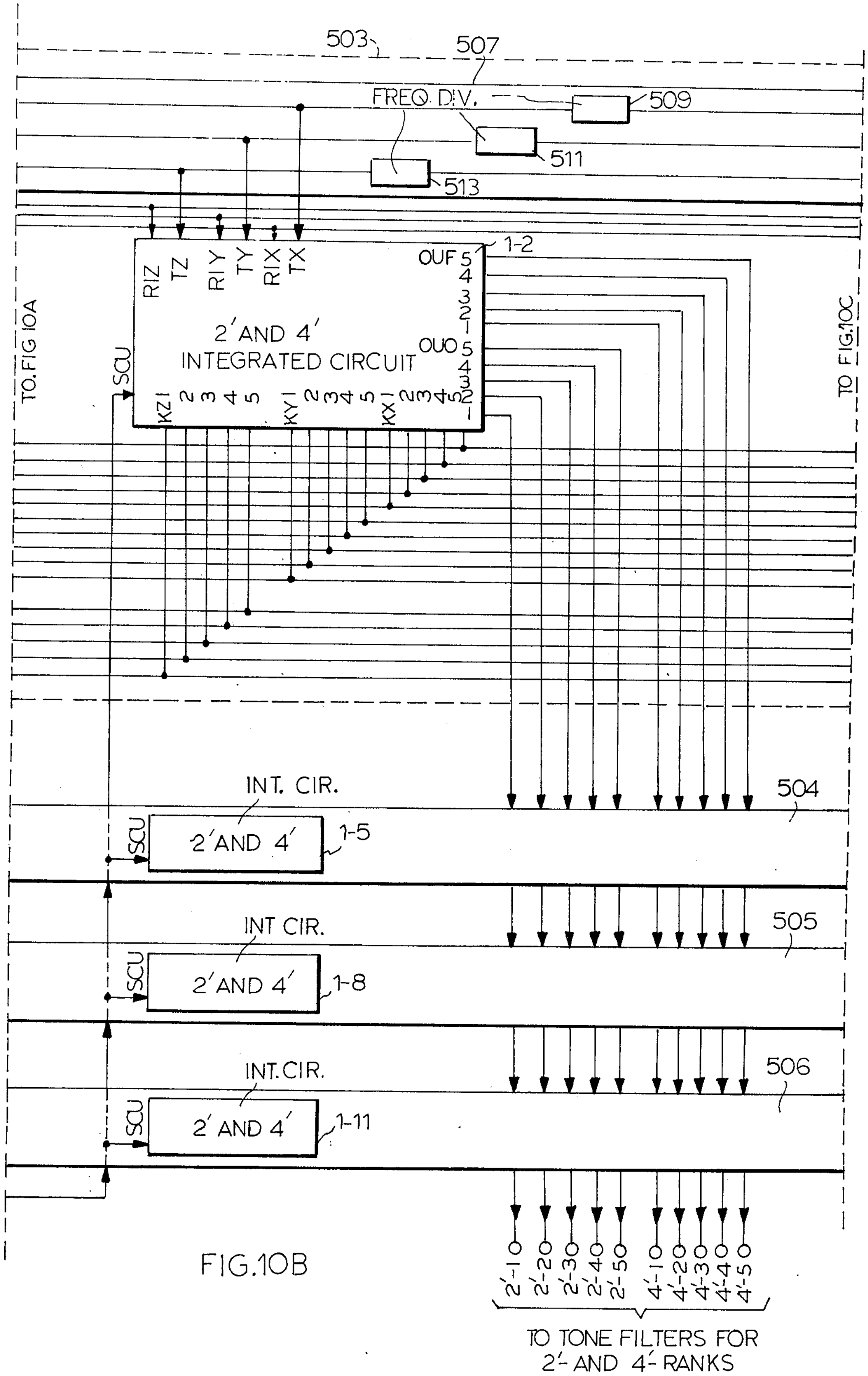
Figure 10C:
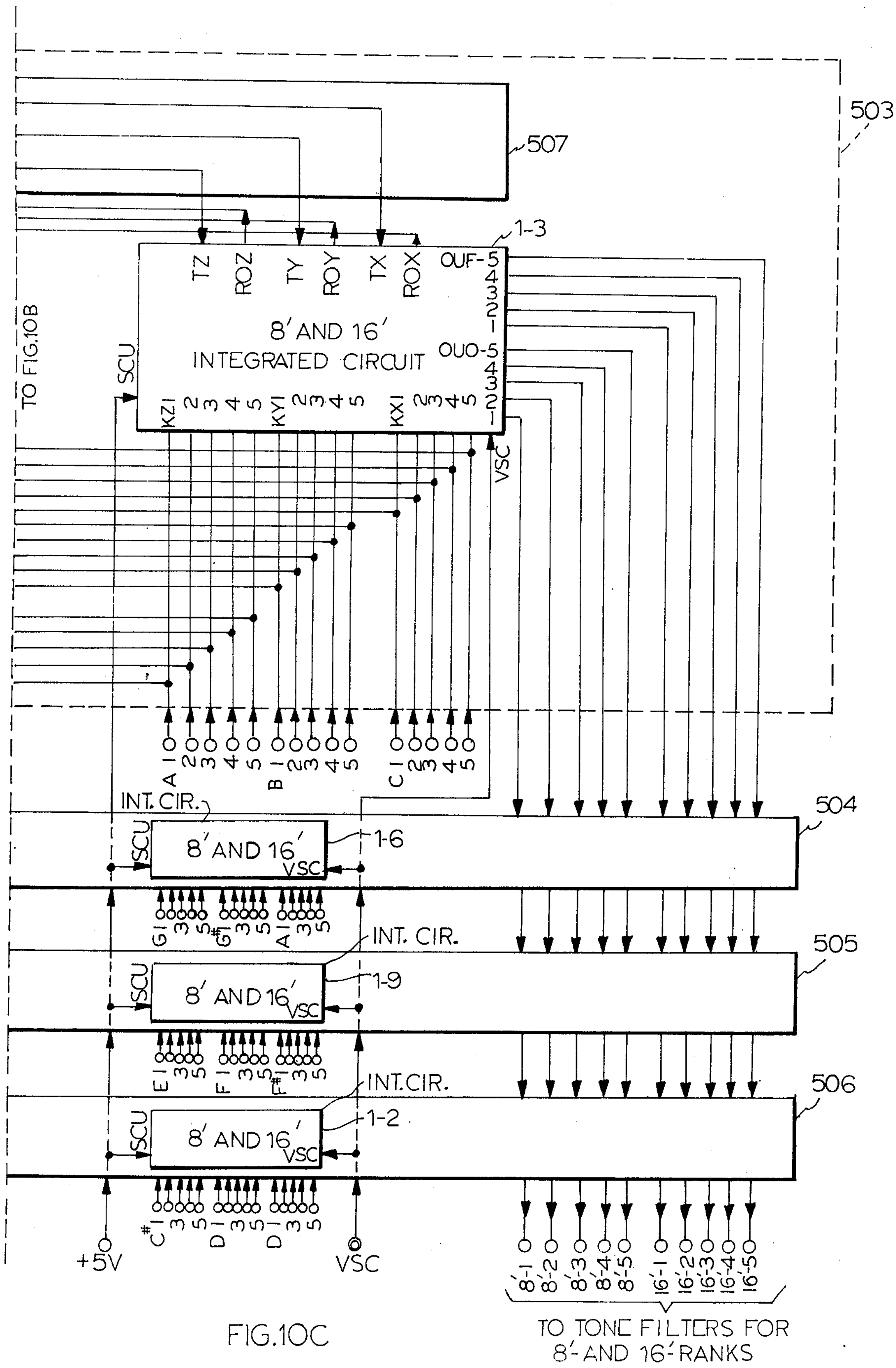

Referring to FIG. 10, an embodiment of an electronic musical instrument is shown which has one manual keyboard of 61 keys and six ranks of feet-coupler, e.g. 16′, 8′, 4′, 2′, 1′, and ½′. In this case, the tone generating circuit comprises 12 (=4×3) integrated circuits 1-1, 1-2, 1-3, . . . . . , and 1-12 each of which is similar to the integrated circuit 1 shown in FIGS. 1 and 3. An output of a master oscillator 501 is applied to a top octave synthesizer 502 which divides the input frequency by twelve different factors of integral numerals so as to generate twelve top octave tone signals of a twelve note equally tempered scale. A well known example of such a top octave synthesizer is S-1857 by American Micor-Systems, Inc. or LM-8071 by Tokyo Sanyo Electric Co., Ltd. Therefore, a detailed description as to the top octave synthesizer 502 will be omitted.

Outputs C, B and A# of the top octave synthesizer 502 are fed to the circuit block 503, outputs A, G# and G thereof are fed to the circuit block 504, outputs F#, F and E thereof are fed to the circuit block 505, and outputs D#, D and C# thereof are fed to the circuit bock 506. The representative circuit block 503 will be described in detail among the circuit blocks 503, 504, 505 and 506 which have structures similar to each other. The outputs C, B and A# of the top octave synthesizer 502 are fed, through an octave adjuster 507, to the terminals TX, TY and TZ of the integrated circuits 1-1, 1-2 and 1-3, respectively. In the octave adjuster 507, the output C is directly applied to the terminal TX of the integrated circuit 1-1, and is applied, through a ¼ frequency divider 508, to the terminal TX of the integrated circuit 1–2, and is then applied, further through another ¼ frequency divider 509, to the terminal TX of the integrated circuit 1-3, respectively. The output B is directly applied to the terminal TY of the integrated circuit 1-1, and is applied, through a ¼ frequency divider 510, to the terminal TY of the integrated circuit 1-2, and is then applied, further through another ¼ frequency divider 511, to the therminal TY of the integrated circuit 1-3, respectively.

The output A# is directly applied to the terminal TZ of the integrated circuit 1-1, and is applied, through a ¼ frequency divider 512, to the terminal TZ of the integrated circuit 1-2, and is then applied, further through another ¼ frequency divider 513, to the terminal TZ of the integrated circuit 1-3, respectively. Thus, these ¼ frequency dividers 508 to 513 distribute the input signals having two octaves relation to each other in each of the series of notes to the input terminals TX, TY and TZ of the integrated circuits 1-1 to 1-3. The control terminals KX1 to KX6, KY1 to KY5 and KZ1 to MZ5 among the integrated circuits 1-1, 1-2 and 1-3 are connected to the control terminals having the same symbols as shown. The control terminals KX1 to KX6 are connected, through the envelope circuits as shown in FIG. 2(*a*), to keyswitches C1 to C6 of the C series of notes respectively. The control terminals KY1 to KY5 are also connected, through the envelope circuits, to keyswitches B1 to B5 of the B series of notes, respectively. The control terminals KZ1 to KZ5 are connected, through the envelope circuits, to key-switches A#1 to A#5 of the A# series of notes, respectively.

In the circuit block 504, although detailed connections are not shown, the control terminals KX1 to KX5 among the integrated circuits 1-4, 1-5 and 1-6 as in the integrated circuits 1-1, 1-2 and 1-3 are connected to the control terminals having the same symbols KX1 to KX5 respectively, and also connected, through the envelope circuits, to the keyswitches A1 to A5 of the A series of notes, respectively. Similarly, the control terminals KY1 to KY5 among the integrated circuits 1-4, 1-5 and 1-6 as in the integrated circuits 1-1, 1-2 and 1-3 are connected to the control terminals having the same symbols KY1 to KY5, respectively, and also connected, through the envelope circuits, to the keyswitches G#1 to G#5 of the G# series of notes, respectively. Similarly, the control terminals KZ1 to KZ5 among the integrated circuits 1-4, 1-5 and 1-6 as in the integrated circuits 1-1, 1-2 and 1-3 are connected to the control terminals having the same symbols KZ1 to KZ5, respectively, and also connected, through the envelope circuits, to the key-switches G1 to G5 of the G series of notes respectively.

Likewise, in the circuit block 505, although detailed connections are not shown, the control terminals KX1 to KX5 among the integrated circuits 1-7, 1-8 and 1-9 as in the integrated circuits 1-1, 1-2 and 1-3 are connected to the control terminals having the same symbols KX1 to KX5, respectively, and also connected, through the envelope circuits, to the keyswitches F#1 to F#5 of the F# series of notes respectively. Similarly, the control terminals KY1 to KY5 among the integrated circuits 1-7, 1-8 and 1-9 as in the integrated circuits 1-1, 1-2 and 1-3 are connected to the control terminals having the same symbols KY1 to KY5, respectively, and also connected, through the envelope circuits, to the keyswitches F1 to F5 of the F series of notes respectively. Similarly, the control terminals KZ1 to KZ5 among the integrated circuits 1-7, 1-8 and 1-9 as in the integrated circuits 1-1, 1-2 and 1-3 are connected to the control terminals having the same symbols KZ1 to KZ5, respectively, and also connected, through the envelope circuits, to the key-switches E1 to E5 of the E series of notes, respectively.

Likewise, in the circuit block 506, although detailed connections are not shown, the control terminals KX1 to KX5 among the integrated circuits 1-10, 1-11 and 1-12 as in the integrated circuits 1-1, 1-2 and 1-3 are connected to the control terminals having the same symbols KX1 to KX5, respectively, and also connected, through the envelope circuits, to the keyswitches D#1 to D#5 of the D# series of notes, respectively. Similarly, the control terminals KY1 to KY5 among the integrated circuits 1-10, 1-11 and 1-12 as in the integrated circuits 1-1, 1-2 and 1-3 are connected to the control terminals having the same symbols KY1 to KY5, respectively, and also connected, through the envelope circuits, to the keyswitches D1 to D5 of the D series of notes, respectively. Similarly, the control terminals KZ1 to KZ5 among the integrated circuits 1-10, 1-11 and 1-12 as in the integrated circuits 1-1, 1-2 and 1-3 are connected to the control terminals having the same symbols KZ1 to KZ5, respectively, and also connected, through the envelope circuits, to the key-switches C#1 to C#5 of the C# series of notes, respectively.

The control terminal KX-6 of the integrated circuits 1-4 to 1-12 are connected to the voltage source VRF(= +5 volts) which is not shown in FIG. 10, so as to always cut off the corresponding keyer-gates which are not required in the tone generator of FIG. 10. Output tone signals from the output terminals OUO-1 to OUO-5 of the integrated circuit 1-1 are mixed with output tone signals from the output terminals OUO-1 to OUO-5 (not shown) of the other integrated circuits 1-4, 1-7 and 1-10 between the same symbols, respectively, so as to produce tone signals of ½′-coupler at output terminals ½′-1 to ½′-5. Output tone signals from the output terminals OUF-1 to OUF-5 of the integrated circuit 1-1 are mixed with output tone signals from the output terminals OUF-1 to OUF-5 (not shown) of the integrated circuits 1-4, 1-7 and 1-10 between the same symbols, respectively, so as to produce tone signals of 1′-coupler at output terminals 1′-1 to 1′-5. These output tones signals from the output terminals ½′-1 to ½′-5 are applied to a tone filter (not shown) of the next stage as tone signals of ½′-coupler. Output tone signals from the output terminals 1′-1 to 1′-5 are applied to another tone filter (not shown) of the next stage as tone signals of 1′-coupler.

Output tone signals from the output terminals OUO-1 to OUO-5 of the integrated circuit 1-2 are mixed with output tone signals from the output terminals OUP-1 to OUO-5 (not shown) of the other integrated circuits 1-5, 1-8 and 1-11 between the same symbols, respectively, so as to produce tone signals of 2′-coupler at output terminals 2′-1 to 2′-5. Output tone signals from the output terminals OUF-1 to OUF-5 of the integrated circuit 1-2 are mixed with output tone signals from the output terminals OUF-1 to OUF-5 (not shown) of the integrated circuits 1-5, 1-8 and 1-11 between the same symbols, respectively, so as to produce tone signals of 4′-coupler at output terminals 4′-1 tp 4′-5. These output tone signals from the output terminals 2′-1 to 2′-5 are applied to a tone filter (not shown) of the next stage as tone signals of 2′-coupler. Output tone signals from the output terminals 4′-1 to 4′-5 are applied to another tone filter (not shown) of the next stage as tone signals of 4′-coupler.

Output tone signals from the output terminals OUO-1 to OUO-5 of the integrated circuit 1-3 are mixed with output tone signals from the output terminals OUO-1 to OUO-5 (not shown) of the other integrated circuits 1-6, 1-9 and 1-12 between the same symbols with each other, so as to produce tone signals of 8′-coupler at output terminals 8′-1 to 8′-5. Output tone signals from the output terminals OUF-1 to OUF-5 of the integrated circuit 1-3 are mixed with output tone signals from the output terminals OUF-1 to OUF-5 (not shown) of the integrated circuits 1-6, 1-9 and 1-12 between the same symbols, respectively, so as to produce tone signals of 16′-coupler at output terminals 16′-1 to 16′-5. These output tone signals from the output terminals 8′-1 to 8′-5 are applied to a tone filter (not shown) of the next stage as tone signals of 8′-coupler. Output tone signals from the output terminals 16′-1 to 16′-5 are applied to another tone filter (not shown) of the next stage as tone signals of 16′-coupler.

The sustain cut terminals SCU of the integrated circuits 1-1, 1-2, 1-4, 1-5, 1-7, 1-8, 1-10 and 1-11 are commonly connected to a voltage source (not shown) of −10 volts, so as to make the sustain control devices 130 to 135 of these integrated circuits in-effective. The sustain cut terminals SCU of the integrated circuits 1-3, 1-6, 1-9 and 1-12 are commonly connected to a voltage source (not shown) of +5 volts, so as to make the sustain control devices 130 to 135 wherein effective.

Figure 11:
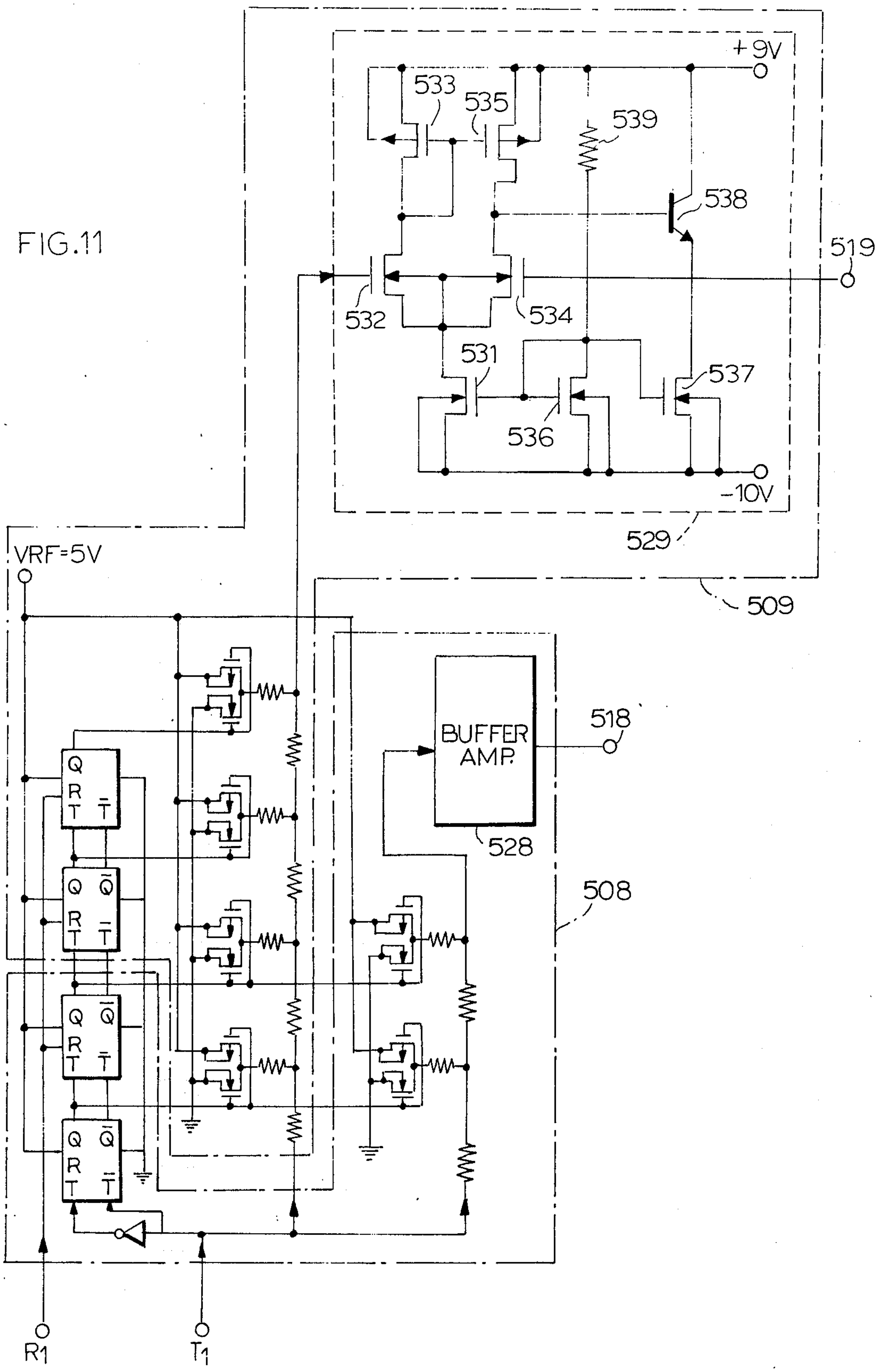
FIG. 11 is a circuit diagram of ½ frequency dividers applicable to the electronic musical instrument of FIG. 10.

Each of the ¼ frequency dividers 508 to 513 can utilize two of the flip-flops shown in FIG. 4 when a rectangular waveform is used for a tone signal. Each of the ¼ frequency dividers 508 to 513 can utilize a circuit similar to that comprising the frequency dividers 100 to 106 and one of the ladder networks 140 to 146, when the staircase or sawtooth waveform is required for a tone signal. Referring to FIG. 11 showing such embodiment, the ¼ frequency dividers 508 and 509 are representatively illustrated. These ¼ frequency dividers 508 and 509 are shown in the parts enclosed by dotted chain lines, respectively, and are similar in the structure to those of FIG. 3, and so detailed descriptions thereof will be omitted here. The outputs of the ¼ frequency dividers 508 and 509 are applied, through buffer amplifiers 528 and 529 for impedance conversion, to the output terminals 528 and 529, respectively. The buffer amplifier 529, as shown in FIG. 11, comprises MOSFET's 531 to 537, an NPN transistor and a resistor 539 and feeds the output signal to the integrated circuits 1-1 to 1-12 (FIG. 10) with a very low output impedance. The buffer amplifier 528 is the same as the buffer amplifier 529. The other ¼ frequency dividers 510 and 511 or 512 and 513 are the same as that shown in FIG. 11, so detailed descriptions thereof will be omitted.

Figure 12:
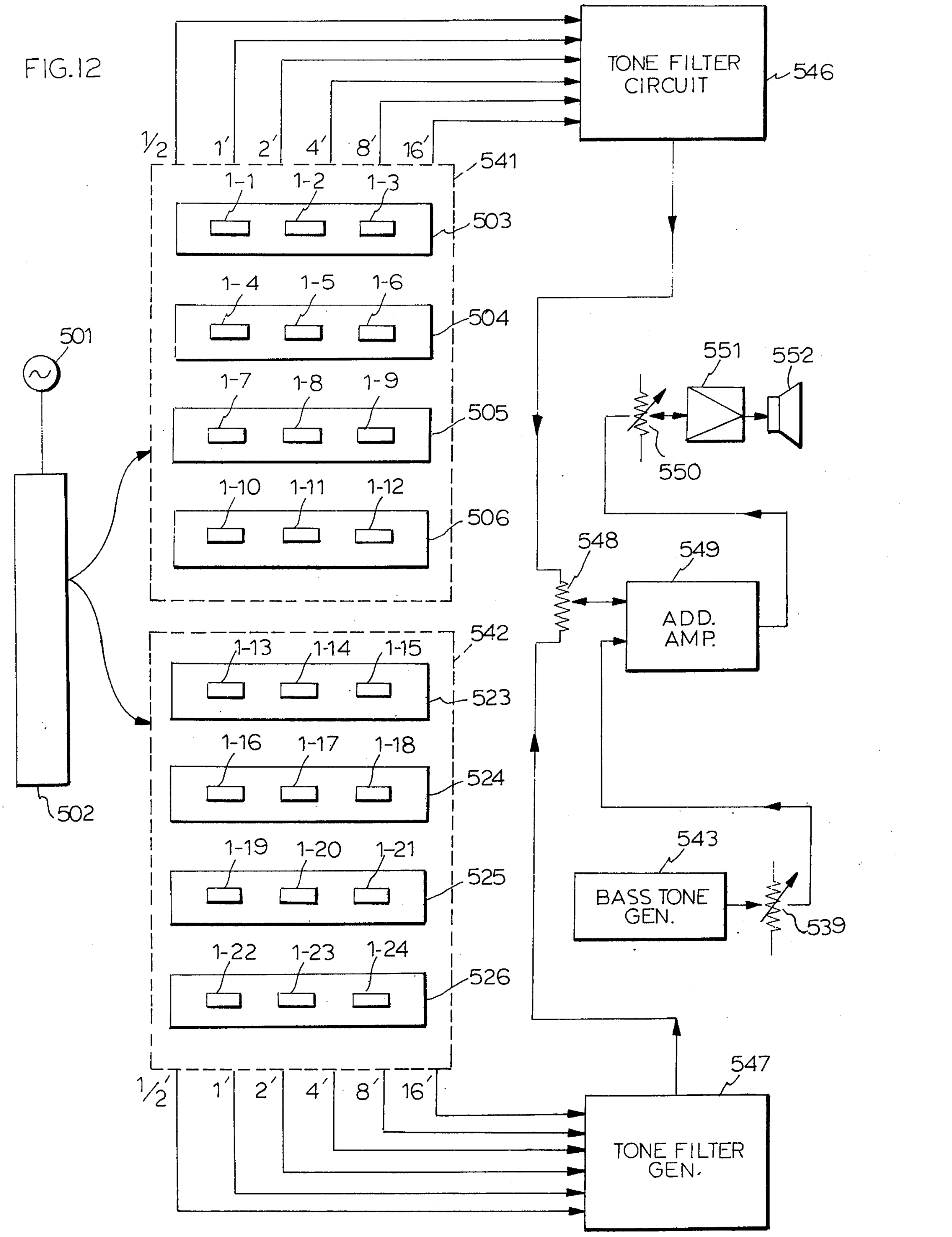
FIG. 12 is a schematic block diagram of another embodiment of an electronic musical instrument which contains two manual keyboards and which utilizes 24 integrated circuits of this invention.

FIG. 12 shows an electrical musical instrument utilizing the integrated circuits 1-1 to 1-24 similar to the integrated circuit 1 shown in FIGS. 1 and 3 and having two manual keyboards each of which controls on and off of six ranks of feet-couplers 16′, 8′, 4′, 2′, 1′ and ½′. Each of the upper and lower keyboards utilizes the circuit blocks 503 to 506 shown in FIG. 10. The integrated circuits 1-13 to 1-24 and the circuit blocks 523 to 526 for the lower manual keyboard are similar to those for upper manual keyboard and are substantially the same as those shown in FIG. 10. The circuit block 541 is similar to the circuit block 542. Outputs of six ranks of feet-couplers ½′, 1′, 2′, 4′, 8′ and 16′ of the circuit block 541 are applied to a tone filter circuit 546 for the lower manual keyboard. Outputs of six ranks of feet-couplers ½′, 1′, 2′, 4′, 8′ and 16′ of the circuit block 542 are applied to a tone filter circuit 547 for the upper manual keyboard. Outputs from the tone filter circuits 546 and 547 are applied, through a balancer 548, an adding amplifier 549, a volume controller 550, and a power amplifier 541, in turn, to a speaker 552 so as to produce a musical sound. A bass tone generator 543 is controller by a pedal keyboard, the output thereof is applied, through a bass volume controller 539 to the adding amplifier 549.

In the structure of the musical instrument shown in FIG. 12, the required number of the integrated circuits 1 (comprising the frequency divider chains, the keyer-gates and the adding circuits) can be increased or decreased in accordance with the required number of the ranks of feet-couplers and also with the number of keyboards. TABLE 2 illustrates relations between the required number of the integrated circuits 1 and the number of ranks of feet-couplers and the number of keyboards, where the integrated circuit 1 handles two ranks of feet-couplers for sixteen tone signals.

While a particular embodiment of this invention is described hereinbefore, it will be apparent that various modifications can be made in the form and construction thereof without departing from the fundamental principles of this invention. It is, therefore, desired by the following claims, to include within the scope of this invention all similar and modified forms of the system disclosed, and by which the results of this invention can be obtained.

TABLE 1 (a)

| | Numbers of keyboards | | One manual keyboard | Two manual keyboards |
|---|---|---|---|---|
| Number of connecting pins (or terminals) | input terminals T | | $n$ | $n$ |
| | reset input terminals RI | | $n$ | $n$ |
| | synchronizing output terminals RO | | $n$ | $n$ |
| | control terminals K | | $ln + 1$ | $2(ln + 1)$ |
| | output terminals OU | | $lm$ | $\frac{3}{2}\, lm$ [*1] |
| | common terminals | | 5 | 6 |
| | sum of terminals | | $n(3 + l) + lm + 6$ | $n(3 + 2l) + \frac{3}{2}\, lm + 8$ |
| (A) Number of connecting pins | general | A | $n(3 + l) + lm \leqq 34$ | $n(3 + 2l) + \frac{3}{2}\, lm \leqq 32$ |
| (or terminals) | formular | N | $N = lmn + n$ | $N = \frac{3}{2}\, lmn + 2m$ |
| (N) Number of processed tone signals | | P | $P = 12/n$ | $P = 12/n$ |
| (P) Number of integrated circuits | 61 keys | A | $8n + 5m \leqq 34$ | $13n + \frac{15}{2}\, m \leqq 32$ |
| | ($l = 5$) | N | $N = 5mn + m$ | $N = \frac{15}{2}\, mn + 2m$ |
| | | P | $P = 12/n$ | $P = 12/n$ |
| | 49 keys | A | $7n + 4m \leqq 34$ | $11n + 6m \leqq 32$ |
| | ($l = 4$) | N | $N = 4mn + m$ | $N = 6mn + 2m$ |
| | | P | $P = 12/n$ | $P = 12/n$ |
| | 44 keys | A | $7n + 4m \leqq 35$ | $11n + 6m \leqq 34$ |
| | ($l = 4$) | N [*2] | $N = 4mn$ | $N = 6mn$ |
| | | P | $P = 12/n$ | $P = 12/n$ |

[*1]: This is based on an assumption that the number of ranks of feet-coupler of the upper manual keyboard is twice of that of the lower manual keyboard.
[*2]: The formular is modified based on the case of 49 keys ($l = 4$) so that no fragment appears in the case of 44 keys.

TABLE 1(b)

| Number of keys ($l$ = number of octave) | m = number of ranks of feet-coupler | One manual keyboard n | N | P | Two manual keyboards n | N | P |
|---|---|---|---|---|---|---|---|
| 61 keys ($l = 5$) | m = 1 | 3 | 16 | 4 | 1 | 9 | 12 |
| | 2 | 3 | 32 | 4 | 1 | 19 | 12 |
| | 3 | 2 | 33 | 6 | | impossible | |
| | 4 | 1 | 24 | 12 | | — | |
| | 5 | 1 | 30 | 12 | | — | |
| | 6 | | impossible | | | — | |
| 49 keys ($l = 4$) [*3] | m = 1 | 4 | 17 | 3 | 2 | 14 | 6 |
| | 2 | 3 | 26 | 4 | 1 | 16 | 12 |
| | 3 | 3 | 39 | 4 | 1 | 24 | 12 |
| | 4 | 2 | 36 | 6 | | impossible | |
| | 5 | 2 | 45 | 6 | | — | |
| | 6 | 1 | 30 | 12 | | — | |
| | 7 | | impossible | | | — | |
| 44 keys ($l = 4$) [*3] | m = 1 | 4 | 16 | 3 | 2 | 12 | 6 |
| | 2 | 3 | 24 | 4 | 2 | 24 | 6 |
| | 3 | 3 | 36 | 4 | 1 | 18 | 12 |
| | 4 | 2 | 32 | 6 | | impossible | |
| | 5 | 2 | 40 | 6 | | — | |
| | 6 | 1 | 24 | 12 | | — | |
| | 7 | 1 | 28 | 12 | | — | |
| | 8 | | impossible | | | — | |

[*3] In the cases of 44 keys and 49 keys, the number of stages $l$ of the frequency dividers per package is modified as $l = 4$ instead of $l = 5$ ($l = 5$ corresponding to the cases of FIG. 1 and FIG. 3).

TABLE 2

| Number of keyboards | Number of ranks of feet-couplers 1st keyboard | 2nd keyboard | 3rd keyboard | Number of integrated circuits required |
|---|---|---|---|---|
| Single keyboard | 2 | | | 4 |
| | 4 | | | 8 |
| | 6 | | | 12 |
| | 8 | | | 16 |
| Two keyboards | 2 | 2 | | 8 |
| | 4 | 2 | | 12 |
| | 4 | 4 | | 16 |
| | 6 | 2 | | 16 |
| | 6 | 4 | | 20 |
| | 6 | 6 | | 24 |
| | 8 | 2 | | 20 |
| | 8 | 4 | | 24 |
| | 8 | 6 | | 28 |
| | 8 | 8 | | 32 |
| Three keyboards | 2 | 2 | 2 | 12 |
| | 4 | 2 | 2 | 16 |
| | 4 | 4 | 2 | 20 |
| | 4 | 4 | 4 | 24 |
| | 6 | 2 | 2 | 20 |
| | 6 | 4 | 2 | 24 |
| | 6 | 4 | 4 | 28 |
| | 6 | 6 | 4 | 32 |
| | 6 | 6 | 6 | 36 |
| | 8 | 2 | 2 | 24 |
| | 8 | 4 | 2 | 28 |
| | 8 | 4 | 4 | 32 |
| | 8 | 6 | 4 | 36 |
| | 8 | 6 | 6 | 40 |
| | 8 | 8 | 6 | 44 |
| | 8 | 8 | 8 | 48 |

What is claimed is:

1. An integrated circuit for an electronic musical instrument comprising a single monolithic layer having:

a plurality of input terminals for receiving input signals;

a plurality of frequency divider chains comprising MOSFET's each having an input connected to one of said plurality of input terminals and a plurality of outputs, for producing a plurality of signals each having a frequency that is an integral fraction of the frequency of the signal applied to the respective input terminal;

a plurality of sets of keyer control terminals each set associated with one of said plurality of frequency divider chains, for receiving keyer control signals;

a plurality of sets of keyer-gates each set associated with one of said plurality of frequency dividers and one of said plurality of sets of keyer control terminals, each keyer-gate comprising MOSFET's and a bipolar transistor emitter follower circuit and having an input connected to a respective one of the outputs of said associated frequency divider chain, a control input connected to a respective one of said keyer control terminals of said associated set of keyer control terminals, and and output, for switching on and off the signal applied to the input thereof according to said respective keyer control signal, said keyer-gates being prepared for at least two ranks of feet coupler;

a plurality of output terminals for producing the outputs of said integrated circuit; and a plurality of adding means comprising a plurality of semiconductor resistors and a bipolar transistor emitter follower circuit each having at least two inputs connected to the outputs of keyer-gates of different sets having the same rank of feet coupler and an output connected to a corresponding one of said plurality of output terminals, for producing an output signal which is the sum of the signals applied to the inputs.

2. An integrated circuit for an electronic musical instrument as claimed in claim 1, in which said integrated circuit further comprises: a reference signal terminal for receiving a reference potential; a sustain control terminal for receiving a sustain control signal; and a plurality of sustain control devices which comprise, on the some monolithic wafer, a first MOSFET one end of the source region of which is connected to said reference terminal, the other end of the source region of which is connected to said sustain control terminal, the gate and the drain of which are jointly coupled to said control terminal of one of said plurality of keyer-gates for controlling the current flow therethrough.

3. An integrated circuit for an electronic musical instrument as claimed in claim 2, in which said integrated circuit further comprises: a sustain cut terminal for receiving a sustain cut signal; and in which each of said plurality of sustain control devices further comprises, on the same monolithic wafer: a second MOSFET which is complementary to said first MOSFET, the source of which is connected to said control terminal of said corresponding keyer-gate, the drain of which is connected to the drain of said first MOSFET, and the gate of which is connected to said sustain cut terminal for controlling the effectiveness of said sustain control device according to the voltage applied to said sustain cut terminal.

4. An integrated circuit for an electronic musical instrument as claimed in claim 1, in which said integrated circuit further comprises, on the same monolithic wafer: a voltage source; a reference potential means; and a plurality of combining means for producing a combined signal each of which is associated with one of the outputs of one of said plurality of frequency divider chains, and each of which is composed of a ladder network and a plurality of pairs of complementary MOSFET's; said ladder netword comprising: a first plurality of resistors connected in series between the corresponding input terminal and said reference potential means; and a second plurality of resistors each of which has one end thereof connected to a respective junction of said first plurality of resistors, and each of which has the other end thereof coupled to a respective output of said frequency divider chain having a frequency greater than or equal to the frequency of said associated output of said frequency divider chain; said combined signal being derived from the junction of said first plurality of resistors nearest to said reference potential means; and said plurality of pairs of complementary MOSFET's being the coupling between said other ends of said second plurality of resistors and said respective outputs of said frequency divider chains, the gates of the P-channel MOSFET and the N-channel MOSFET of each of said plurality of pairs of complementary pairs of MOSFET's being jointly connected to said respective output of said frequency divider chain, the drains of said P-channel MOSFET and said N-channel MOSFET being jointly connected to said other end of said respective resistor of said second plurality of resistors, the source of said P-channel MOSFET being connected to said voltage source, and the source of said N-channel MOSFET being connected to said reference potential means; whereby each of said plurality of combining means is capable of combining one of said input signals having a sawtooth waveform with all the output signals of said frequency divider chain having a frequency greater than or equal to the frequency of said associated output of said frequency divider chain, so as to produce a combined signal having sawtooth waveform divided in frequency at the junction of said first plurality of resistors nearest to said reference potential.

5. An integrated circuit for an electronic musical instrument as claimed in claim 1, in which said integrated circuit further comprises: a first and second voltage source; and in which each of said keyer-gates comprises a first, second and third MOSFET, and an emitter follower circuit; the gate and the drain of said first MOSFET being jointly connected to said first voltage source, the source of said first MOSFET being connected to the drain of said second MOSFET, the source of said second MOSFET being connected to the drain of said third MOSFET, the source of said third MOSFET being connected to said second voltage source, the input signal being applied to the gate of said third MOSFET, the control signal for the keyer-gate being applied to the gate of said second MOSFET, the input of said emitter follower circuit being connected jointly to said drain of said second MOSFET and said source of said first MOSFET and the output of said emitter follower circuit being the output of said keyer-gate.

6. An integrated circuit for an electronic musical instrument as claimed in claim 1 in which each of said adding means comprises: a plurality of resistor means each having a first terminal connected to one of the inputs of said adding means and a second terminal; and an emitter follower circuit having an input connected jointly to said second terminals of said resistor means and an output connected to the output of said adding means.

* * * * *